(12) United States Patent
Nagasawa et al.

(10) Patent No.: US 10,522,172 B2
(45) Date of Patent: Dec. 31, 2019

(54) OSCILLATOR AND CALCULATING DEVICE

(71) Applicant: KABUSHIKI KAISHA TOSHIBA, Tokyo (JP)

(72) Inventors: Tazumi Nagasawa, Yokohama Kanagawa (JP); Hirofumi Suto, Kawasaki Kanagawa (JP); Michinaga Yamagishi, Zama Kanagawa (JP); Taro Kanao, Kawasaki Kanagawa (JP); Koichi Mizushima, Kamakura Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 40 days.

(21) Appl. No.: 15/921,987

(22) Filed: Mar. 15, 2018

(65) Prior Publication Data

US 2018/0374502 A1    Dec. 27, 2018

(30) Foreign Application Priority Data

Jun. 22, 2017    (JP) .................................. 2017-122133

(51) Int. Cl.
*G11B 5/39* (2006.01)
*G11B 5/31* (2006.01)
(Continued)

(52) U.S. Cl.
CPC .......... *G11B 5/3909* (2013.01); *G11B 5/3153* (2013.01); *G11C 11/1697* (2013.01);
(Continued)

(58) Field of Classification Search
CPC .................................................. G11B 5/3909
(Continued)

(56) References Cited

U.S. PATENT DOCUMENTS 8,897,047 B2    11/2014 Bourianoff et al.
9,070,389 B2    6/2015 Kudo et al.
(Continued)

FOREIGN PATENT DOCUMENTS

JP    2011-198399 A    10/2011
JP    2015-8026 A    1/2015
(Continued)

OTHER PUBLICATIONS

Hitoshi Kubota et al., "Spin-Torque Oscillator Based on Magnetic Tunnel Junction with a Perpendicularly Magnetized Free Layer and In-Plane Magnetized Polarizer." Applied Physics Express (APEX) 6 103003 (2013) 3 pages.
(Continued)

*Primary Examiner* — Joseph Chang
(74) *Attorney, Agent, or Firm* — Finnegan, Henderson, Farabow, Garrett & Dunner, L.L.P.

(57) ABSTRACT

According to one embodiment, an oscillator includes a first element. The first element includes first and second magnetic layers, and a first nonmagnetic layer. The first magnetic layer includes first and second magnetic films, and a first nonmagnetic film. The second magnetic film is provided between the second magnetic layer and the first magnetic film. The first nonmagnetic layer is provided between the second magnetic film and the second magnetic layer. An orientation of a first magnetization of the first magnetic film has a reverse component of an orientation of a second magnetization of the second magnetic film. A first magnetic field is applied to the first element. The first element is in a first state when a first current flows in the first element. An electrical resistance of the first element in the first state includes first and second electrical resistances repeating alternately.

18 Claims, 8 Drawing Sheets

(51) Int. Cl.
*H01L 43/08* (2006.01)
*G11C 11/56* (2006.01)
*G11C 11/16* (2006.01)
*H01L 43/02* (2006.01)

(52) U.S. Cl.
CPC .......... *G11C 11/5607* (2013.01); *H01L 43/08* (2013.01); *H01L 43/02* (2013.01)

(58) Field of Classification Search
USPC ....................................................... 331/94.1
See application file for complete search history.

(56) References Cited

U.S. PATENT DOCUMENTS

| | | | |
|---|---|---|---|
| 9,418,720 | B1 | 8/2016 | Kudo |
| 2011/0228423 | A1 | 9/2011 | Koui et al. |
| 2012/0139649 | A1* | 6/2012 | Zhou .................... H03B 15/006 331/94.1 |
| 2017/0039472 | A1 | 2/2017 | Kudo |
| 2017/0077394 | A1 | 3/2017 | Saida |

FOREIGN PATENT DOCUMENTS

| | | |
|---|---|---|
| JP | 2016-162978 A | 9/2016 |
| JP | 2017-33385 A | 2/2017 |
| JP | 2017-59690 A | 3/2017 |

OTHER PUBLICATIONS

Bochong Wang et al., "Diameter dependence of emission power in MgO-based nano-pillar spin-torque oscillators," Appl. Phys. Lett. 108, 253502 (2016) 5 pages.

* cited by examiner

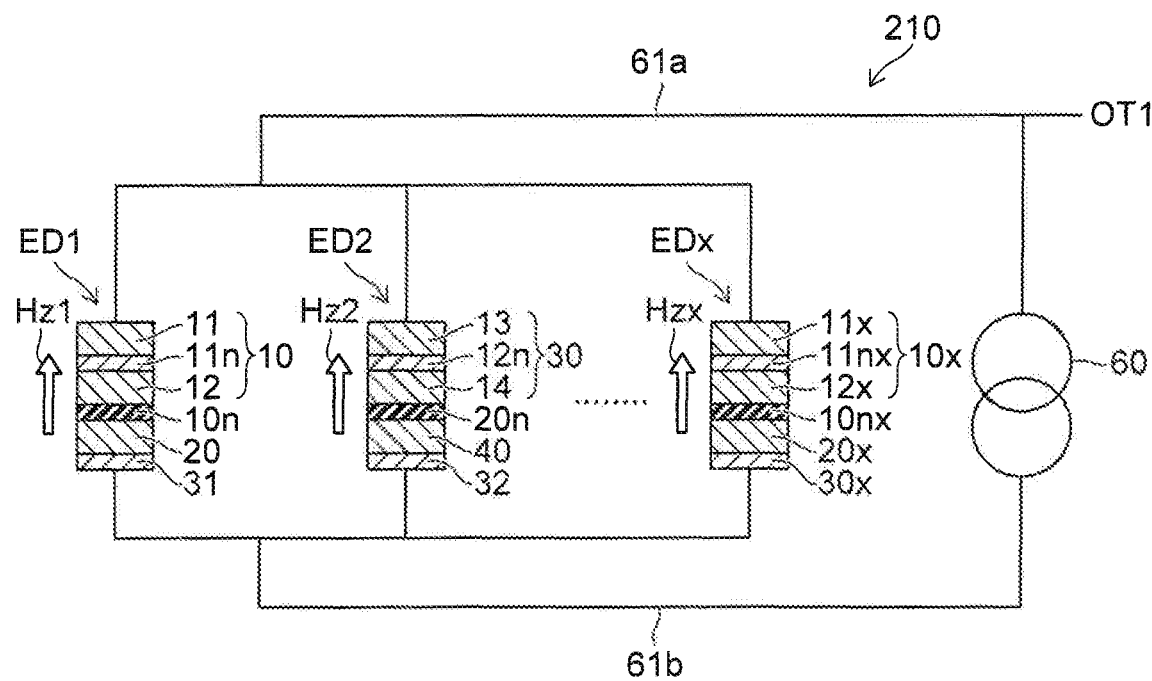
FIG. 1A
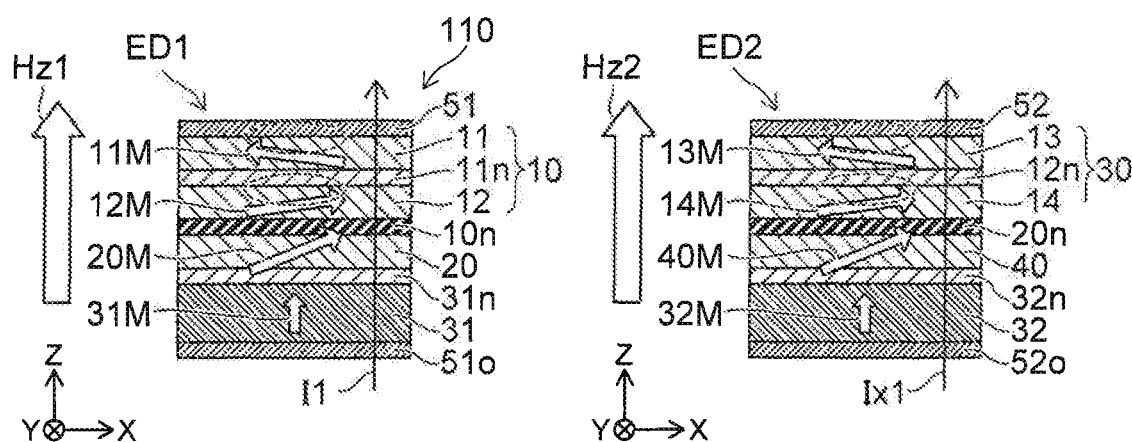
FIG. 1B                    FIG. 1C

OSCILLATOR AND CALCULATING DEVICE

CROSS-REFERENCE TO RELATED APPLICATIONS

This application is based upon and claims the benefit of priority from Japanese Patent Application No. 2017-122133, filed on Jun. 22, 2017; the entire contents of which are incorporated herein by reference.

FIELD

Embodiments described herein relate generally to an oscillator and a calculating device.

BACKGROUND

Magnetizations of multiple magnetic layers included in an element are caused to oscillate by causing a current to flow in the element while applying a magnetic field to the element. There is an oscillator that uses such a phenomenon. A calculating device that uses the oscillator also has been proposed. Stable operations of the oscillator and the calculating device are desirable.

BRIEF DESCRIPTION OF THE DRAWINGS

FIG. 1A to FIG. 1C are schematic views illustrating an oscillator according to a first embodiment;

DETAILED DESCRIPTION

Figure 2A:
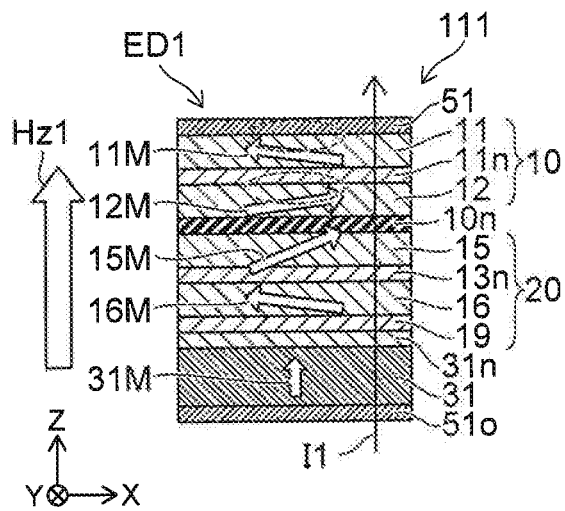
FIG. 2A and FIG. 2B are schematic cross-sectional views illustrating another oscillator according to the first embodiment.

According to one embodiment, an oscillator includes a first element. The first element includes a first magnetic layer, a second magnetic layer, and a first nonmagnetic layer. The first magnetic layer includes a first magnetic film, a second magnetic film, and a first nonmagnetic film provided between the first magnetic film and the second magnetic film. The second magnetic film is provided between the second magnetic layer and the first magnetic film. The first nonmagnetic layer is provided between the second magnetic film and the second magnetic layer. An orientation of a first magnetization of the first magnetic film has a reverse component of an orientation of a second magnetization of the second magnetic film. A first magnetic field along a first direction is applied to the first element. The first direction is from the second magnetic film toward the first magnetic film. The first element is in a first state when a first current flows along the first direction in the first element. An electrical resistance of the first element in the first state includes a first electrical resistance and a second electrical resistance repeating alternately. The second electrical resistance is lower than the first electrical resistance.

According to another embodiment, an oscillator includes a first element, and a second element. The first element includes a first magnetic layer, a second magnetic layer, and a first nonmagnetic layer. The first magnetic layer includes a first magnetic film, a second magnetic film, and a first nonmagnetic film provided between the first magnetic film and the second magnetic film. The second magnetic film is provided between the second magnetic layer and the first magnetic film. The first nonmagnetic layer is provided between the second magnetic film and the second magnetic layer. The second element includes a third magnetic layer, a fourth magnetic layer, and a second nonmagnetic layer. The third magnetic layer includes a third magnetic film, a fourth magnetic film, and a second nonmagnetic film provided between the third magnetic film and the fourth magnetic film. The fourth magnetic film is provided between the fourth magnetic layer and the third magnetic film. The second nonmagnetic layer is provided between the fourth magnetic film and the fourth magnetic layer. The first magnetic layer is electrically connected to the third magnetic layer. The second magnetic layer is electrically connected to the fourth magnetic layer. An orientation of a first magnetization of the first magnetic film has a reverse component of an orientation of a second magnetization of the second magnetic film. A first magnetic field along a first direction is applied to the first element. The first direction is from the second magnetic film toward the first magnetic film. The first element is in a first state when a first current flows along the first direction in the first element. An electrical resistance of the first element in the first state includes a first electrical resistance and a second electrical resistance repeating alternately. The second electrical resistance is lower than the first electrical resistance. The first element is in a second state when a second current flows along the first direction in the first element. The absolute value of the second current is less than the absolute value of the first current. A third electrical resistance of the first element in the second state is lower than at least one of the first electrical resistance or the second electrical resistance.

According to another embodiment, an oscillator includes a first element, and a second element. The first element includes a first magnetic layer, a second magnetic layer, a first nonmagnetic layer, and a first magnetic portion. The first magnetic layer includes a first magnetic film, a second magnetic film, and a first nonmagnetic film provided between the first magnetic film and the second magnetic film. The second magnetic film is provided between the second magnetic layer and the first magnetic film. The first nonmagnetic layer is provided between the second magnetic film and the second magnetic layer. A direction from the first magnetic portion toward the first magnetic layer is aligned with a first direction. The first direction is from the second magnetic film toward the first magnetic film. A first magnetic portion magnetization of the first magnetic portion is aligned with the first direction. The second element includes a third magnetic layer, a fourth magnetic layer, a second nonmagnetic layer, and a second magnetic portion. The third magnetic layer includes a third magnetic film, a fourth magnetic film, and a second nonmagnetic film provided between the third magnetic film and the fourth magnetic film. The fourth magnetic film is provided between the fourth magnetic layer and the third magnetic film. The second nonmagnetic layer is provided between the fourth magnetic film and the fourth magnetic layer. A direction from the second magnetic portion toward the third magnetic layer is aligned with a second element direction. The second element direction is from the fourth magnetic film toward the third magnetic film. A second magnetic portion magnetization of the second magnetic portion is aligned with the second element direction. The first magnetic layer is electrically connected to the third magnetic layer. The second magnetic layer is electrically connected to the fourth magnetic layer. An orientation of a first magnetization of the first magnetic film has a reverse component of an orientation of a second magnetization of the second magnetic film. The first element is in a first state when a first current flows along the first direction in the first element. An electrical resistance of the first element in the first state includes a first electrical resistance and a second electrical resistance repeating alternately. The second electrical resistance is lower than the first electrical resistance. The first element is in a second state when a second current flows along the first direction in the first element. The absolute value of the second current is less than the absolute value of the first current. A third electrical resistance of the first element in the second state is lower than at least one of the first electrical resistance or the second electrical resistance.

According to another embodiment, a calculating device includes the oscillator described above, a current supply circuit portion configured to supply a current to the first element and the second element, and a sense circuit configured to sense a temporal change of the first electrical resistance and the second electrical resistance in the first state.

Various embodiments will be described hereinafter with reference to the accompanying drawings.

The drawings are schematic and conceptual; and the relationships between the thickness and width of portions, the proportions of sizes among portions, etc., are not necessarily the same as the actual values thereof. Further, the dimensions and proportions may be illustrated differently among drawings, even for identical portions.

In the specification and drawings, components similar to those described or illustrated in a drawing thereinabove are marked with like reference numerals, and a detailed description is omitted as appropriate.

First Embodiment

FIG. 1A to FIG. 1C are schematic views illustrating an oscillator according to a first embodiment.

FIG. 1B and FIG. 1C are schematic cross-sectional views illustrating a portion of the oscillator.

As shown in FIG. 1A, the oscillator 210 according to the embodiment includes a first element ED1. In the example, the oscillator 210 includes multiple elements EDx (the first element ED1, a second element ED2, etc.).

The multiple elements EDx (the first element ED1, the second element ED2, etc.) are electrically connected in parallel with each other. Each of the multiple elements EDx is electrically connected to a current supply circuit 60. For example, the current supply circuit 60 and one end of each of the multiple elements EDx are electrically connected by a first interconnect 61a. For example, the current supply circuit 60 and the other end of each of the multiple elements EDx are electrically connected by a second interconnect 61b. For example, the current supply circuit 60 is configured to supply a current to the multiple elements EDx (the first element ED1, the second element ED2, etc.). The current supply circuit 60 may be included in the oscillator 210. The current supply circuit 60 may be provided separately from the oscillator 210.

One of the multiple elements EDx includes a magnetic layer 10x, a magnetic layer 20x, and a nonmagnetic layer 10nx. The nonmagnetic layer 10nx is provided between the magnetic layer 10x and the magnetic layer 20x. The one of the multiple elements EDx further includes a magnetic portion 30x. The magnetic portion 30x is stacked with the magnetic layer 10x, the magnetic layer 20x, and the nonmagnetic layer 10nx. A magnetic field Hzx along the stacking direction is applied to each (one) of the multiple elements EDx. For example, the magnetic field Hzx may be based on a magnetic field generated from the magnetic portion 30x.

For example, the first element ED1 includes, for example, a first magnetic layer 10, a second magnetic layer 20, a first nonmagnetic layer 10n, and a first magnetic portion 31. The second element ED2 includes, for example, a third magnetic layer 30, a fourth magnetic layer 40, a second nonmagnetic layer 20n, and a second magnetic portion 32. Examples of these layers and magnetic portions are described below.

A first magnetic field Hz1 is applied to the first element ED1. A second magnetic field Hz2 is applied to the second element ED2. For example, the first magnetic field Hz1 may be based on a magnetic field generated from the first magnetic portion 31. For example, the second magnetic field Hz2 may be based on a magnetic field generated from the second magnetic portion 32.

An alternating current-like change of the electrical resistance occurs in the multiple elements EDx when a current that is not less than the threshold flows in the multiple elements EDx (the first element ED1, the second element ED2, etc.). The change of the electrical resistance corresponds to an oscillation. For example, the change of the electrical resistance is outputtable at an output terminal OT1 of the oscillator 210.

The change (the oscillation) of the electrical resistance is caused by, for example, the rotation (e.g., the precession) of the magnetizations of the magnetic layers included in each of these elements. For example, the rotation of the magnetizations is based on spin-transfer torque.

Examples of the multiple elements EDx (the first element ED1, the second element ED2, etc.) will now be described.

FIG. 1B illustrates the first element ED1. The first element ED1 may be considered to be one oscillator 110.

As described above, the first element ED1 includes, for example, the first magnetic layer 10, the second magnetic layer 20, the first nonmagnetic layer 10n, and the first magnetic portion 31.

The first magnetic layer 10 includes a first magnetic film 11, a second magnetic film 12, and a first nonmagnetic film 11n. The first nonmagnetic film 11n is provided between the first magnetic film 11 and the second magnetic film 12.

A direction from the second magnetic film 12 toward the first magnetic film 11 is taken as a first direction. The first direction corresponds to a Z-axis direction. One direction perpendicular to the Z-axis direction is taken as an X-axis direction. A direction perpendicular to the Z-axis direction and the X-axis direction is taken as a Y-axis direction.

For example, the first magnetic film 11, the second magnetic film 12, and the first nonmagnetic film 11n spread along the X-Y plane.

The second magnetic film 12 is positioned between the second magnetic layer 20 and the first magnetic film 11. The first nonmagnetic layer 10n is provided between the second magnetic film 12 and the second magnetic layer 20.

The direction from the first magnetic portion 31 toward the first magnetic layer 10 is aligned with the first direction (the Z-axis direction) recited above. A first magnetic portion magnetization 31M of the first magnetic portion 31 is aligned with the first direction (the Z-axis direction). The first magnetic portion 31 is, for example, a perpendicular magnetization film.

A first element nonmagnetic layer 31n is further provided in the example. The second magnetic layer 20 is positioned between the first magnetic portion 31 and the first magnetic layer 10. The first element nonmagnetic layer 31n is positioned between the first magnetic portion 31 and the second magnetic layer 20. The first element nonmagnetic layer 31n includes, for example, a nonmagnetic metal, etc.

The first magnetic film 11 has a first magnetization 11M. The second magnetic film 12 has a second magnetization 12M. The orientation of the first magnetization 11M has a reverse component of the orientation of the second magnetization 12M. For example, the first magnetic film 11 and the second magnetic film 12 are antiferromagnetically coupled to each other.

For example, the first magnetization 11M and the second magnetization 12M cross the first direction (the Z-axis direction). For example, the first magnetization 11M and the second magnetization 12M cross the Z-axis direction in a state in which a current does not flow in the first element ED1. For example, the directions of these magnetizations may be aligned with the X-Y plane. The first magnetic film 11 and the second magnetic film 12 are, for example, in-plane magnetization films.

The second magnetic layer 20 has a second magnetic layer magnetization 20M. The second magnetic layer magnetization 20M crosses the first direction (the Z-axis direction). The second magnetic layer 20 is, for example, an in-plane magnetization film.

A first conductive layer 51 and a first opposing conductive layer 51o are provided in the example. The first magnetic layer 10, the second magnetic layer 20, the first nonmagnetic layer 10n, and the first magnetic portion 31 are provided between these conductive layers.

The first conductive layer 51 is electrically connected to the first interconnect 61a (referring to FIG. 1A). The first opposing conductive layer 51o is electrically connected to the second interconnect 61b (referring to FIG. 1A).

The first magnetic field Hz1 is applied to the first element ED1. The first magnetic field Hz1 is aligned with the Z-axis direction. A current I1 flows in the first element ED1. The current I1 flows through the first element ED1 along the Z-axis direction. The current I1 is supplied from the current supply circuit 60.

An oscillation is generated in the first element ED1 when the magnitude of the current I1 is not less than a threshold. Examples of the oscillation are described below.

FIG. 1C illustrates the second element ED2. The second element ED2 may be considered to be another example of one oscillator 110.

As described above, the second element ED2 includes, for example, the third magnetic layer 30, the fourth magnetic layer 40, the second nonmagnetic layer 20n, and the second magnetic portion 32.

The third magnetic layer 30 includes a third magnetic film 13, a fourth magnetic film 14, and a second nonmagnetic film 12n. The second nonmagnetic film 12n is provided between the third magnetic film 13 and the fourth magnetic film 14.

The direction from the fourth magnetic film 14 toward the third magnetic film 13 is taken as a second element direction. In the example, for example, the second element direction is aligned with the Z-axis direction (the first direction).

The fourth magnetic film 14 is positioned between the fourth magnetic layer 40 and the third magnetic film 13. The second nonmagnetic layer 20n is provided between the fourth magnetic film 14 and the fourth magnetic layer 40.

The direction from the second magnetic portion 32 toward the third magnetic layer 30 is aligned with the second element direction (in the example, the Z-axis direction). A second magnetic portion magnetization 32M of the second magnetic portion 32 is aligned with the second element direction (in the example, the Z-axis direction). The second magnetic portion 32 is, for example, a perpendicular magnetization film.

A second element nonmagnetic layer 32n is further provided in the example. The fourth magnetic layer 40 is positioned between the second magnetic portion 32 and the third magnetic layer 30. The second element nonmagnetic layer 32n is positioned between the second magnetic portion 32 and the fourth magnetic layer 40. The second element nonmagnetic layer 32n includes, for example, a nonmagnetic metal, etc.

The third magnetic film 13 has a third magnetization 13M. The fourth magnetic film 14 has a fourth magnetization 14M. The orientation of the third magnetization 13M has a reverse component of the orientation of the fourth magnetization 14M. For example, the third magnetic film 13 and the fourth magnetic film 14 are antiferromagnetically coupled to each other.

The third magnetization 13M and the fourth magnetization 14M cross the second element direction (in the example, the Z-axis direction). The third magnetic film 13 and the fourth magnetic film 14 are, for example, in-plane magnetization films.

The fourth magnetic layer 40 has a fourth magnetic layer magnetization 40M. The fourth magnetic layer magnetization 40M crosses the second element direction (in the example, the Z-axis direction). The fourth magnetic layer 40 is, for example, an in-plane magnetization film.

A second conductive layer 52 and a second opposing conductive layer 52o are provided in the example. The third magnetic layer 30, the fourth magnetic layer 40, the second nonmagnetic layer 20n, and the second magnetic portion 32 are provided between these conductive layers.

The second conductive layer 52 is electrically connected to the first interconnect 61a (referring to FIG. 1A). The second opposing conductive layer 52o is electrically connected to the second interconnect 61b (referring to FIG. 1A).

The first magnetic layer 10 is electrically connected to the third magnetic layer 30. The second magnetic layer 20 is electrically connected to the fourth magnetic layer 40. For example, the first conductive layer 51 is electrically connected to the second conductive layer 52. For example, the first opposing conductive layer 51o is electrically connected to the second opposing conductive layer 52o. For example, the first magnetic film 11 is electrically connected to the third magnetic film 13.

The second magnetic field Hz2 is applied to the second element ED2. The second magnetic field Hz2 is aligned with the Z-axis direction. A current Ix1 flows in the second element ED2. The current Ix1 flows through the second element ED2 along the Z-axis direction. The current Ix1 is supplied from the current supply circuit 60.

An oscillation is generated in the second element ED2 when the magnitude of the current Ix1 is not less than a threshold. Oscillations are generated in the multiple elements EDx provided in the oscillator 210.

Figure 2B:
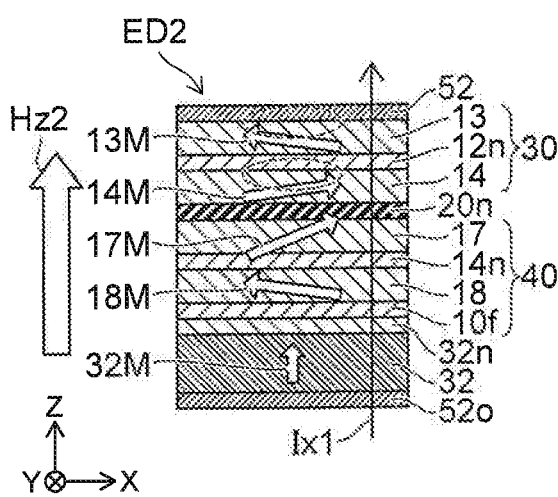

FIG. 2A and FIG. 2B are schematic cross-sectional views illustrating another oscillator according to the first embodiment.

The first element ED1 illustrated in FIG. 2A corresponds to the oscillator 111 according to the embodiment. In the oscillator 111, the second magnetic layer 20 includes multiple magnetic films. Otherwise, the configuration of the oscillator 111 is similar to the configuration of the oscillator 110.

In the first element ED1 of the oscillator 111, the second magnetic layer 20 includes a fifth magnetic film 15, a sixth magnetic film 16, and a third nonmagnetic film 13n. The fifth magnetic film 15 is positioned between the sixth magnetic film 16 and the second magnetic film 12. For example, the fifth magnetic film 15 is positioned between the sixth magnetic film 16 and the first nonmagnetic layer 10n. The third nonmagnetic film 13n is positioned between the fifth magnetic film 15 and the sixth magnetic film 16.

In the example, the second magnetic layer 20 further includes a ninth magnetic film 19. The ninth magnetic film 19 is, for example, a bias applying film. The sixth magnetic film 16 is positioned between the ninth magnetic film 19 and the fifth magnetic film 15. The ninth magnetic film 19 includes, for example, at least one selected from the group consisting of IrMn and PtMn.

The fifth magnetic film 15 has a fifth magnetization 15M. The sixth magnetic film 16 has a sixth magnetization 16M. The fifth magnetization 15M and the sixth magnetization 16M cross the first direction (the Z-axis direction). The fifth magnetic film 15 and the sixth magnetic film 16 are, for example, in-plane magnetization films. The orientation of the fifth magnetization 15M has a reverse component of the orientation of the sixth magnetization 16M. For example, the fifth magnetic film 15 and the sixth magnetic film 16 are antiferromagnetically coupled to each other.

The second element ED2 illustrated in FIG. 2B may be considered to correspond to one other oscillator 111 according to the embodiment. The fourth magnetic layer 40 includes multiple magnetic films.

For example, the fourth magnetic layer 40 includes a seventh magnetic film 17, an eighth magnetic film 18, and a fourth nonmagnetic film 14n. The seventh magnetic film 17 is positioned between the eighth magnetic film 18 and the fourth magnetic film 14. For example, the seventh magnetic film 17 is positioned between the eighth magnetic film 18 and the second nonmagnetic layer 20n. The fourth nonmagnetic film 14n is positioned between the seventh magnetic film 17 and the eighth magnetic film 18.

In the example, the fourth magnetic layer 40 further includes a tenth magnetic film 10f. The tenth magnetic film 10f is, for example, a bias applying film. The eighth magnetic film 18 is positioned between the tenth magnetic film 10f and the seventh magnetic film 17. The tenth magnetic film 10f includes, for example, at least one selected from the group consisting of IrMn and PtMn.

The seventh magnetic film 17 has a seventh magnetization 17M. The eighth magnetic film 18 has an eighth magnetization 18M. The seventh magnetization 17M and the eighth magnetization 18M cross the second element direction (in the example, the Z-axis direction). The seventh magnetic film 17 and the eighth magnetic film 18 are, for example, in-plane magnetization films. The orientation of the seventh magnetization 17M has a reverse component of the orientation of the eighth magnetization 18M. For example, the seventh magnetic film 17 and the eighth magnetic film 18 are antiferromagnetically coupled to each other.

Thus, the second magnetic layer 20 and the fourth magnetic layer 40 each may include multiple magnetic films that are antiferromagnetically coupled.

For example, the first element ED1 and the second element ED2 correspond to TMR (Tunnel Magneto Resistance) elements.

Oscillations are generated in such multiple elements EDx (the first element ED1, the second element ED2, etc.). For example, the operation of the second element ED2 is similar to the operation of the first element ED1. An example of the oscillation of the first element ED1 will now be described.

Figure 3A:
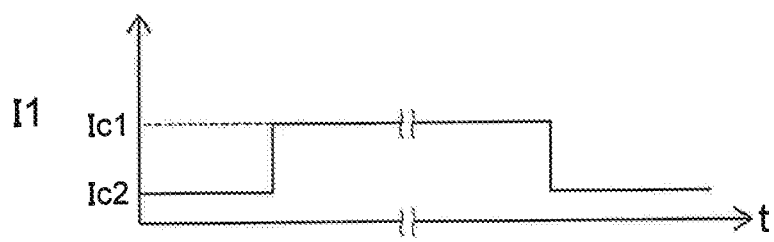
FIG. 3A and FIG. 3B are schematic views illustrating characteristics of the oscillator according to the first embodiment.
Figure 3B:
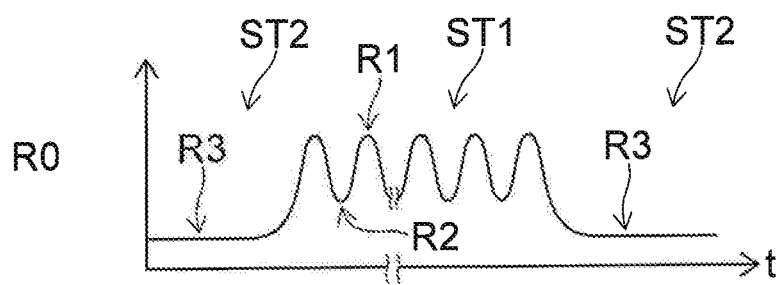

FIG. 3A and FIG. 3B are schematic views illustrating characteristics of the oscillator according to the first embodiment.

In these figures, the horizontal axis is time. The vertical axis of FIG. 3A is the current I1 supplied to the first element ED1. The current I1 is, for example, a direct current. The vertical axis of FIG. 3B is an electrical resistance R0 of the first element ED1. For example, the change of the electrical resistance R0 corresponds to the change of the electrical resistance between the first magnetic layer 10 and the second magnetic layer 20. For example, the change of the electrical resistance R0 corresponds to the change of the electrical resistance between the first conductive layer 51 and the first opposing conductive layer 51o.

As shown in FIG. 3A, the current I1 is set to a first current Ic1 in one interval. The current I1 is set to a second current Ic2 in another interval. The first current Ic1 is not less than a threshold at which the oscillation is generated. The second current Ic2 is less than the threshold at which the oscillation is generated.

As shown in FIG. 3B, the electrical resistance R0 changes repeatedly when the first current Ic1 flows. In other words, oscillation occurs.

Thus, the first element ED1 is in a first state ST1 when the first current Ic1 flows along the first direction (the Z-axis direction) in the first element ED1. The first state ST1 corresponds to an oscillating state. In the first state ST1, the electrical resistance R0 of the first element ED1 includes a first electrical resistance R1 and a second electrical resistance R2 repeating alternately. The second electrical resistance R2 is lower than the first electrical resistance R1. The first electrical resistance R1 corresponds to a relatively high electrical resistance of the first element ED1 in the oscillating state. The second electrical resistance R2 corresponds to a relatively low electrical resistance of the first element ED1 in the oscillating state.

On the other hand, the first element ED1 is in a second state ST2 when the second current Ic2 flows along the first direction (the Z-axis direction) in the first element ED1. The absolute value of the second current Ic2 is less than the absolute value of the first current Ic1. The second state ST2 corresponds to a non-oscillating state. The second current Ic2 is smaller than the threshold. In the second state ST2, the first element ED1 has a third electrical resistance R3. In the second state ST2, the third electrical resistance R3 of the first element ED1 is lower than the first electrical resistance R1. For example, the third electrical resistance R3 may be not more than the second electrical resistance R2.

The second current Ic2 is, for example, a measurement current for measuring the electrical resistance R0 of the first element ED1 in the non-oscillating state.

Thus, the electrical resistance R0 (the third electrical resistance R3) in the non-oscillating state is lower than the relatively high electrical resistance (the first electrical resistance R1) in the oscillating state. Thereby, a stable operation is possible.

For example, for one condition, there is a case where the orientation of the second magnetic layer magnetization 20M of the second magnetic layer 20 is the same as the orientation of the second magnetization 12M of the second magnetic film 12 in the non-oscillating state. For another one condition, there is a case where the orientation of the second magnetic layer magnetization 20M of the second magnetic layer 20 is the reverse of the orientation of the second magnetization 12M of the second magnetic film 12 in the non-oscillating state. The former corresponds to a parallel magnetization state. The latter corresponds to an antiparallel magnetization state.

In the parallel magnetization state, the electrical resistance R0 (the third electrical resistance R3) in the non-oscillating state is low. In the parallel magnetization state, the first electrical resistance R1 is higher than the third electrical resistance R3 when the oscillation is generated in the first element ED1 by the current I1 (the first current Ic1) being the threshold or more.

On the other hand, in the antiparallel magnetization state, the electrical resistance R0 (the third electrical resistance R3) in the non-oscillating state is high. In the antiparallel magnetization state, the electrical resistance R0 (e.g., the first electrical resistance R1) when the oscillation is generated in the first element ED1 by the current I1 (the first current Ic1) being the threshold or more is lower than the third electrical resistance R3.

Thus, two types of states (e.g., the parallel state and the antiparallel state) are considered. In the case where the multiple elements EDx (e.g., the first element ED1, the second element ED2, etc.) are provided, the characteristics (e.g., the threshold currents) of the multiple elements EDx may be nonuniform. In such a case, in the case of the antiparallel magnetization state recited above, when an oscillation is generated in one element EDx, the electrical resistance of the one element EDx becomes low; and the current that is supplied from the current supply circuit 60 flows preferentially in the one element EDx. Therefore, the current does not flow easily in the other elements EDx. Thereby, there are cases where it is difficult to obtain a stable operation.

In the embodiment, for example, a condition that corresponds to the parallel magnetization state recited above is employed. In the embodiment, the third electrical resistance R3 of the first element ED1 in the second state ST2 is lower than the first electrical resistance R1. Thereby, when an oscillation is generated in one element EDx, the electrical resistance of the one element EDx becomes high. The current that is supplied from the current supply circuit 60 flows easily in the other elements EDx. Thereby, oscillations are generated easily in the other elements EDx. In the case where the multiple elements EDx are provided, it is easier to obtain a uniform and stable operation. According to the embodiment, an oscillator can be provided in which a stable operation is possible.

In the embodiment, for example, in the second state ST2 (the non-oscillating state), the orientation of the second magnetic layer magnetization 20M of the second magnetic layer 20 is the same as, for example, the orientation of the second magnetization 12M of the second magnetic film 12.

For example, the orientation of the fifth magnetization 15M of the fifth magnetic film 15 is the same as the orientation of the second magnetization 12M of the second magnetic film 12 in the case where the second magnetic layer 20 includes the fifth magnetic film 15, the sixth magnetic film 16, and the third nonmagnetic film 13n (the case of the oscillator 111).

In the embodiment, the second element ED2 also oscillates. For example, the second element ED2 is in a third state when a third current flows along the second element direction (the Z-axis direction) in the second element ED2. In the third state, the electrical resistance of the second element ED2 includes a fourth electrical resistance R4 and a fifth electrical resistance R5 repeating alternately. The fifth electrical resistance R5 is lower than the fourth electrical resistance R4.

The second element ED2 is in a fourth state when a fourth current flows along the second element direction (the Z-axis direction) in the second element ED2. The absolute value of the fourth current is less than the absolute value of the third current. The third state is, for example, the oscillating state. The fourth state is, for example, the non-oscillating state.

The temporal changes of the fourth electrical resistance R4 and the fifth electrical resistance R5 are synchronous with the temporal changes of the first electrical resistance R1 and the second electrical resistance R2. For example, the oscillation of the second element ED2 is synchronous with the oscillation of the first element ED1.

In the second element ED2 as well, it is favorable for the electrical resistance in the non-oscillating state to be lower than the electrical resistance in the oscillating state. For example, it is favorable for a sixth electrical resistance R6 of the second element ED2 to be lower than the fourth electrical resistance R4 in the fourth state. A stable operation (oscillation) is easier to obtain.

For example, the third state corresponds to the first state ST1. For example, the fourth state corresponds to the second state ST2. For example, the third current corresponds to the first current Ic1. For example, the fourth current corresponds to the second current Ic2. For example, the fourth electrical resistance R4 corresponds to the first electrical resistance R1. For example, the fifth electrical resistance R5 corresponds to the second electrical resistance R2. For example, the sixth electrical resistance R6 corresponds to the third electrical resistance R3.

In the oscillators 110 and 111 according to the embodiment, the first magnetic layer 10 includes the first magnetic film 11 and the second magnetic film 12 recited above. Thereby, a more stable oscillation is obtained.

Examples of the characteristics of the oscillations for examples of the oscillator 111 will now be described.

Figures 4A, 4B, 4C:
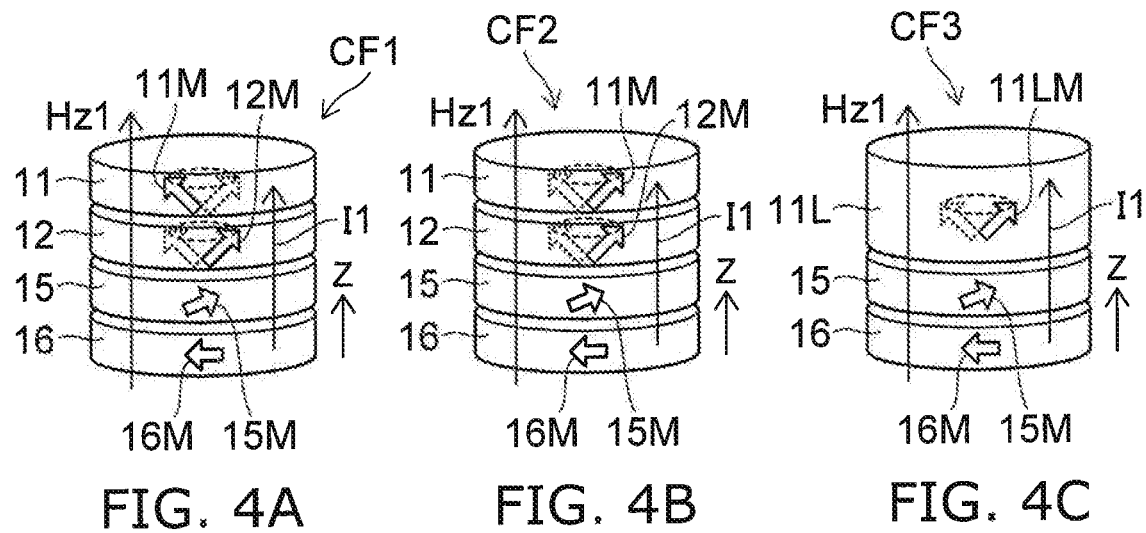
FIG. 4A to FIG. 4C are schematic views illustrating simulation models of the characteristics of the oscillator.

FIG. 4A to FIG. 4C are schematic views illustrating simulation models of the characteristics of the oscillator.

As shown in FIG. 4A, the first magnetic film 11, the second magnetic film 12, the fifth magnetic film 15, and the sixth magnetic film 16 are provided in a first configuration CF1. The first magnetization 11M of the first magnetic film 11 has a reverse component of the orientation of the second magnetization 12M of the second magnetic film 12. The first magnetic film 11 and the second magnetic film 12 are antiferromagnetically coupled to each other.

The first magnetic film 11, the second magnetic film 12, the fifth magnetic film 15, and the sixth magnetic film 16 are provided in a second configuration CF2 as well. The orientation of the first magnetization 11M of the first magnetic film 11 is the same as the orientation of the second magnetization 12M of the second magnetic film 12. The first magnetic film 11 and the second magnetic film 12 are ferromagnetically coupled to each other.

In a third configuration CF3, the first magnetic film 11 and the second magnetic film 12 are not provided; and one magnetic film 11L is provided. The magnetic film 11L has a magnetization 11LM.

In the first to third configurations CF1 to CF3, the fifth magnetic film 15 and the sixth magnetic film 16 are antiferromagnetically coupled to each other. The fifth magnetic film 15 and the sixth magnetic film 16 are, for example, in-plane magnetization films.

The first nonmagnetic film 11n is not illustrated in FIG. 4A and FIG. 4B. The third nonmagnetic film 13n is not illustrated in FIG. 4A to FIG. 4C. The first magnetic portion 31 is not provided in the first to third configurations CF1 to CF3.

A micromagnetics simulator is used in the simulation. In the simulation, the Gilbert damping constant is 0.02 for the first magnetic film 11, the second magnetic film 12, the fifth magnetic film 15, and the sixth magnetic film 16. For these magnetic films, the exchange stiffness constant is $1.6 \times 10^{-6}$ erg/cm. For these magnetic films, the saturation magnetization is 1.2 kemu/cm$^3$. The thickness (the length along the Z-axis direction) is 2 nm for each of these magnetic films.

The Gilbert damping constant is 0.02 for the magnetic film 11L of the third configuration CF3. The exchange stiffness constant of the magnetic film 11L is $1.6 \times 10^{-6}$ erg/cm. The saturation magnetization of the magnetic film 11L is 1.2 kemu/cm$^3$. The thickness (the length along the Z-axis direction) of the magnetic film 11L is 4 nm.

The length in one direction crossing the Z-axis direction (one direction aligned with the X-Y plane) is 54 nm for the first magnetic film 11, the second magnetic film 12, the fifth magnetic film 15, the sixth magnetic film 16, and the magnetic film 11L. The length in another one direction crossing the Z-axis direction (one direction aligned with the X-Y plane) is 44 nm for each of these magnetic films. The planar configuration (the configuration aligned with the X-Y plane) is an ellipse for each of these magnetic films.

In the first configuration CF1, the magnitude of the antiferromagnetic coupling between the first magnetic film 11 and the second magnetic film 12 is −0.6 erg/cm$^2$. The distance between the first magnetic film 11 and the second magnetic film 12 is 1 nm.

In the second configuration CF2, the magnitude of the ferromagnetic coupling between the first magnetic film 11 and the second magnetic film 12 is +0.6 erg/cm$^2$. The distance between the first magnetic film 11 and the second magnetic film 12 is 1 nm.

In the first to third configurations CF1 to CF3, the magnitude of the antiferromagnetic coupling between the fifth magnetic film 15 and the sixth magnetic film 16 is −0.6 erg/cm$^2$. The distance between the fifth magnetic film 15 and the sixth magnetic film 16 is 1 nm.

The distance between the second magnetic film 12 and the fifth magnetic film 15 is 1 nm. The mutual spin torque between the second magnetic film 12 and the fifth magnetic film 15 is considered. The spin polarization ratio is 0.6.

Figure 5A:
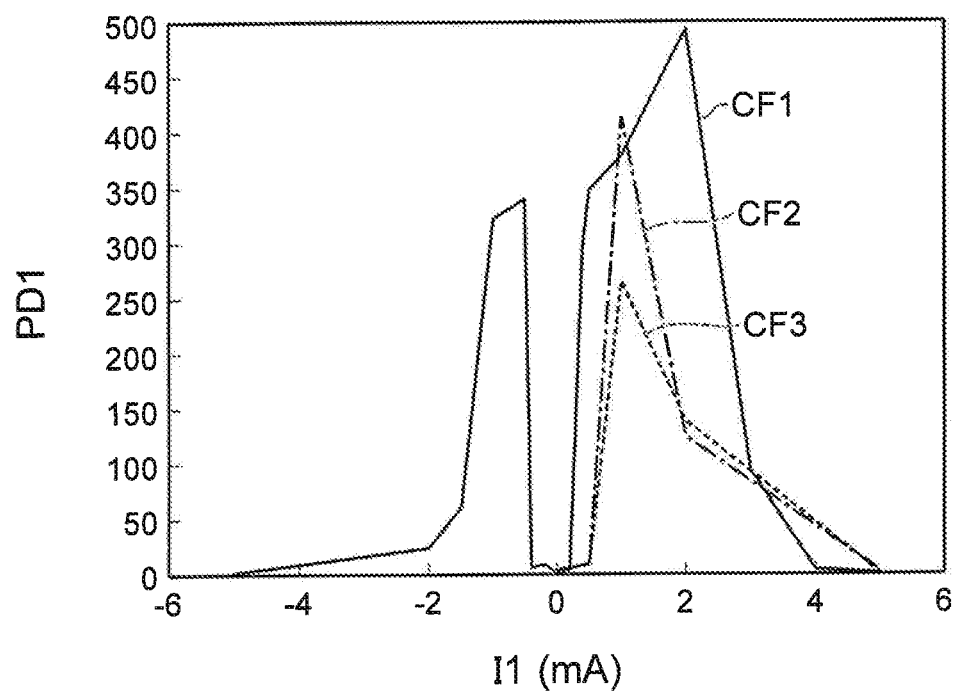
FIG. 5A and FIG. 5B are graphs illustrating simulation results of the characteristics of the oscillator.
Figure 5B:
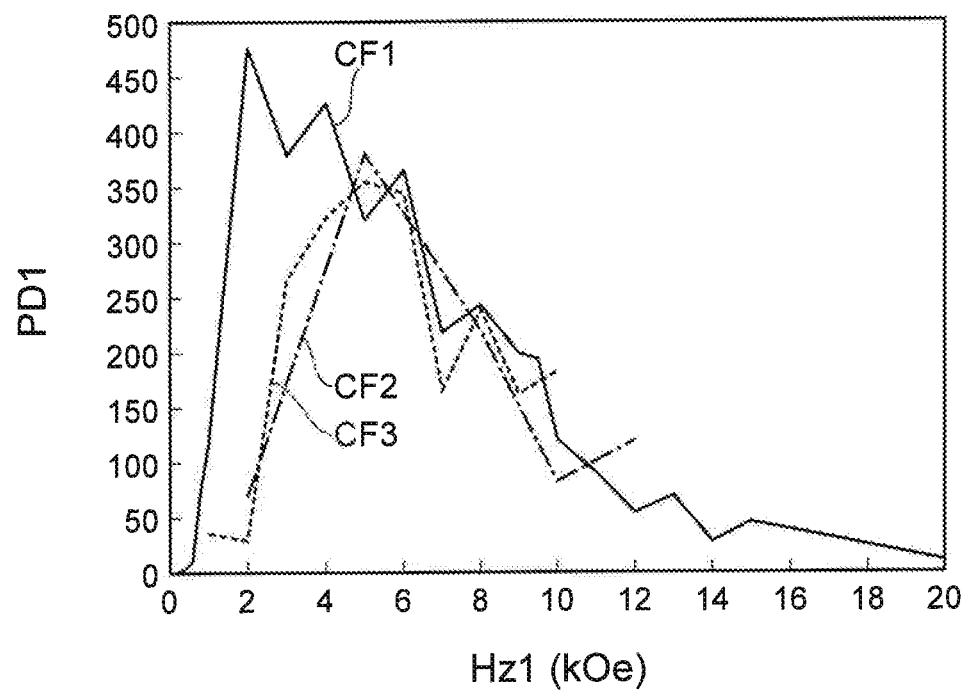

FIG. 5A and FIG. 5B are graphs illustrating simulation results of the characteristics of the oscillator.

The horizontal axis of FIG. 5A is the current I1 (mA) supplied to the first element ED1 (the first to third configurations CF1 to CF3). The horizontal axis of FIG. 5B is the first magnetic field Hz1 (kOe) applied to the first element ED1. In these figures, the vertical axis is a maximum value PD1 of the power spectral density of the electrical resistance of the first element ED1.

For the characteristics illustrated in FIG. 5A, the first magnetic field Hz1 is 3 kOe. When the current I1 is positive, the maximum value PD1 of the power spectral density of the resistance is greater than zero for the first to third configurations CF1 to CF3. When the current I1 is positive, it is considered that out-of-plane oscillations of the first magnetization 11M and the second magnetization 12M are generated for the first to third configurations CF1 to CF3.

As shown in FIG. 5A, the maximum value PD1 of the power spectral density of the first configuration CF1 is larger than the maximum value PD1 of the power spectral density of the second configuration CF2. The maximum value PD1 of the power spectral density of the third configuration CF3 is smaller than the maximum value PD1 of the power spectral density of the second configuration CF2.

In the first configuration CF1, the range of the current I1 where a large maximum value PD1 of the power spectral density is obtained is wider than that of the second configuration CF2.

When the current I1 is negative, the maximum value PD1 of the power spectral density is substantially zero for the second configuration CF2 and the third configuration CF3. Conversely, for the first configuration CF1, a large maximum value PD1 of the power spectral density also is obtained when the current I1 is negative.

Thus, in the first configuration CF1, the maximum value PD1 of the power spectral density is large. The range of the current I1 in which the large maximum value PD1 of the power spectral density is obtained is wide.

In the first configuration CF1 as shown in FIG. 5B, a large maximum value PD1 of the power spectral density is obtained also for a small first magnetic field Hz1. For one first magnetic field Hz1, the maximum value PD1 of the power spectral density of the first configuration CF1 is larger than the maximum value PD1 of the power spectral density of the second configuration CF2. For one first magnetic field Hz1, the maximum value PD1 of the power spectral density of the first configuration CF1 is larger than the maximum value PD1 of the power spectral density of the third configuration CF3. In the first configuration CF1, a stable out-of-plane oscillation is obtained also for a small external magnetic field (first magnetic field Hz1).

Thus, a stable oscillation is obtained for the first configuration CF1. In the embodiment, a stable operation is possible.

In the embodiment, two ferromagnetic films (the first magnetic film 11 and the second magnetic film 12) are antiferromagnetically coupled to each other. The second magnetic layer magnetization 20M of the second magnetic layer 20 crosses the Z-axis direction. The first magnetic field Hz1 (e.g., the perpendicular magnetic field) is applied to the first element ED1 having such a structure. The current I1 is supplied along the Z-axis direction to the first element ED1. Thereby, a stable oscillation is obtained. A stable change of the resistance is obtained. For example, a high-output oscillation is obtained.

Compared to the third configuration CF3 (the magnetic film 11L), for example, a spatial nonuniformity of the effective magnetic field can be suppressed by using the first magnetic film 11 and the second magnetic film 12. For example, a spatially uniform magnetization oscillation can be excited. Thereby, a larger output than that of the third configuration CF3 can be obtained.

An example of measurement results of the characteristics of the oscillator will now be described.

The first magnetic portion 31 is not provided in the samples. In the samples, a stacked film that includes Ta/Cu/Ta is formed as a lower electrode on a sapphire substrate. Subsequently, CMP processing is performed. Subsequently, multiple films that are used to form the TMR element are formed in an ultra-high vacuum sputtering apparatus.

The TMR element has a configuration of an upper electrode (e.g., the first conductive layer 51)/Ta/Ru/Ta/first magnetic layer 10/first nonmagnetic layer 10n/second magnetic layer 20/Ru/Ta/lower electrode (the first opposing conductive layer 51o).

In the first magnetic layer 10, the first magnetic film 11 is a CoFe film having a thickness of 1.5 nm. The first nonmagnetic film 11n is a Ru film having a thickness of 0.85 nm. The second magnetic film 12 is a CoFeB film having a thickness of 2.0 nm.

The first nonmagnetic layer 10n is a MgO film.

In the second magnetic layer 20, the fifth magnetic film 15 is a CoFeB film having a thickness of 2.0 nm. The third nonmagnetic film 13n is a Ru film having a thickness of 0.85 nm. The sixth magnetic film 16 is a CoFe film having a thickness of 2.5 nm. The ninth magnetic film 19 (the bias applying film) is an IrMn film having a thickness of 7.0 nm.

The first conductive layer 51 (the upper electrode) is a stacked film of Ta/Cu/Ta. The thickness of the stacked film is 200 nm. The first opposing conductive layer 51o (the lower electrode) is a stacked film of Au/Ti. The thickness of the stacked film is 200 nm.

A resistance per area RA of the first nonmagnetic layer 10n is 0.5 $\Omega \cdot \mu m^2$. The resistance per area RA is measured by CIPT.

Annealing in a magnetic field is performed after forming the multiple films recited above. In the annealing in the magnetic field, the magnetic field is 6400 Oe; the temperature is 300° C.; and the time is 1 hour. Thereby, for example, the crystallization of the MgO film and the CoFeB film progresses.

Subsequently, a stacked body that includes the multiple films recited above is patterned. In the patterning, EB lithography and ion milling are performed. Thereby, the first element ED1 is obtained. The length along one direction (e.g., the length along the X-axis direction) of the first element ED1 is 50 nm. The length along another direction (e.g., the length along the Y-axis direction) of the first element ED1 is 150 nm.

The out-of-plane oscillation is obtained by applying the first magnetic field Hz1 to the first element ED1 and supplying the current I1 to the first element ED1.

Figure 6:
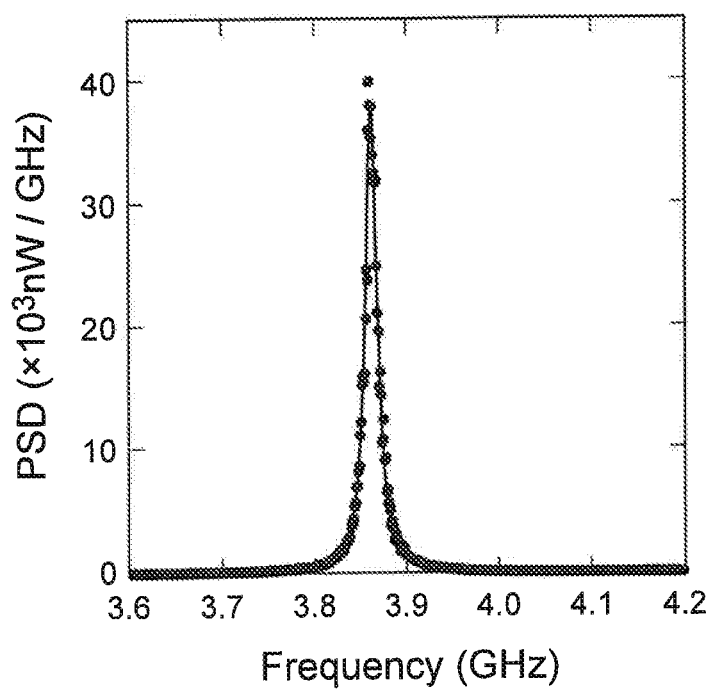
FIG. 6 is a graph illustrating measurement results of a characteristic of the oscillator.

FIG. 6 is a graph illustrating measurement results of a characteristic of the oscillator.

In FIG. 6, an external magnetic field (corresponding to the first magnetic field Hz1) of 5880 Oe is applied to the first element ED1. A current I1 of 3.8 mA is caused to flow in the first element ED1. The current I1 is from the second magnetic layer 20 toward the first magnetic layer 10. The horizontal axis of FIG. 6 is the frequency. The vertical axis is a power spectral density PSD ($\times 10^3$ nW/GHz).

It can be seen from FIG. 6 that a sharp peak is observed. The frequency at the position of the peak is about 3.67 GHz.

The output can be estimated from the characteristic curve shown in FIG. 6 by fitting. The estimated output is about 0.93 μW. Thus, in the embodiment, a large, output is obtained.

In the embodiment, it is favorable for the Z-axis direction component of the first magnetization 11M of the first magnetic film 11 and the Z-axis direction component of the second magnetization 12M of the second magnetic film 12 to have the same orientation. For example, in the example shown in FIG. 2A, the first magnetization 11M is upward in the drawing; and the second magnetization 12M is upward in the drawing. The second magnetization 12M may be downward in the drawing when the first magnetization 11M is downward in the drawing.

For example, the component along the first direction (the Z-axis direction) of the orientation of the first magnetization 11M is from the second magnetic film 12 toward the first magnetic film 11; and the component along the first direction of the orientation of the second magnetization 12M is from the second magnetic film 12 toward the first magnetic film 11. Or, the component along the first direction of the orientation of the first magnetization 11M is from the first magnetic film 11 toward the second magnetic film 12; and the component along the first direction of the orientation of the second magnetization 12M is from the first magnetic film 11 toward the second magnetic film 12.

In such a case, for example, a stable out-of-plane oscillation is obtained. As a result, a high output is obtained. For example, the magnetizations of the two magnetic films tilt upward toward one orientation and oscillate in the plane in directions that are mutually-different by 180 degrees.

In the embodiment, for example, in the case where the antiferromagnetic coupling between the first magnetic film 11 and the second magnetic film 12 is excessively strong, the orientation of the component along the first direction (the Z-axis direction) of the orientation of the first magnetization 11M may be the reverse of the orientation of the component along the first direction of the orientation of the second magnetization 12M. In such a case, the directions in which the magnetizations of the two magnetic films rotate naturally become reversed from each other. Therefore, a stable oscillation may be difficult to obtain.

Figures 7A, 7B:
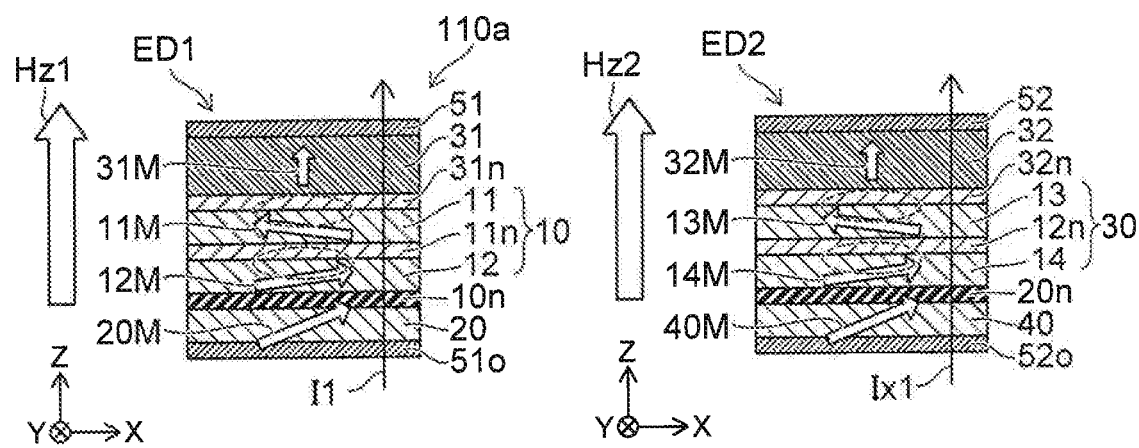
FIG. 7A and FIG. 7B are schematic cross-sectional views illustrating another oscillator according to the first embodiment.

FIG. 7A and FIG. 7B are schematic cross-sectional views illustrating another oscillator according to the first embodiment.

The first element ED1 illustrated in FIG. 7A corresponds to the oscillator 110a according to the embodiment. The position of the first magnetic portion 31 in the oscillator 110a is different from the position of the first magnetic portion 31 in the oscillator 110. Otherwise, the configuration of the oscillator 110a is similar to the configuration of the oscillator 110.

As shown in FIG. 7A, the first element nonmagnetic layer 31n is provided in the oscillator 110a as well. The first magnetic layer 10 is positioned between the first magnetic portion 31 and the second magnetic layer 20. The first element nonmagnetic layer 31n is positioned between the first magnetic portion 31 and the first magnetic layer 10. The first element nonmagnetic layer 31n is positioned between the first magnetic portion 31 and the first magnetic film 11. In the oscillator 110a (the first element ED1), the first magnetic field Hz1 is based on at least a portion of the magnetic field generated from the first magnetic portion 31.

The position of the second magnetic portion 32 of the second element ED2 illustrated in FIG. 7B is different from the position of the second magnetic portion 32 of the second element ED2 illustrated in FIG. 2B. Otherwise, the configuration of the second element ED2 illustrated in FIG. 7B is similar to the configuration of the second element ED2 illustrated in FIG. 2B.

The second element nonmagnetic layer 32n is provided as shown in FIG. 7B. The third magnetic layer 30 is positioned between the second magnetic portion 32 and the fourth magnetic layer 40. The second element nonmagnetic layer 32n is positioned between the second magnetic portion 32 and the third magnetic layer 30. For example, the second element nonmagnetic layer 32n is positioned between the second magnetic portion 32 and the third magnetic film 13. The second magnetic field Hz2 of the second element ED2 is based on at least a portion of the magnetic field generated from the second magnetic portion 32.

Figure 8A:
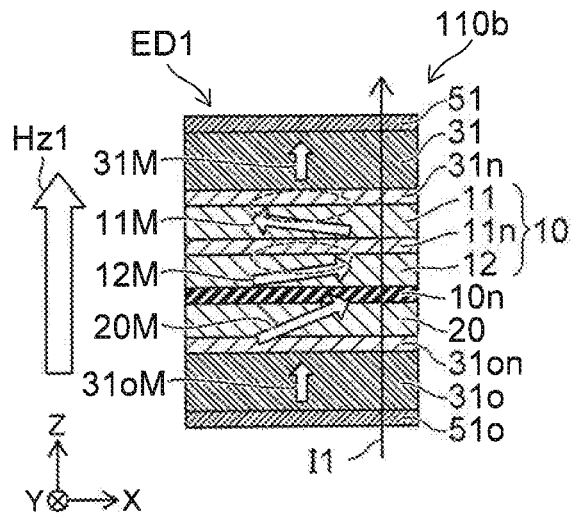
FIG. 8A and FIG. 8B are schematic cross-sectional views illustrating another oscillator according to the first embodiment.
Figure 8B:
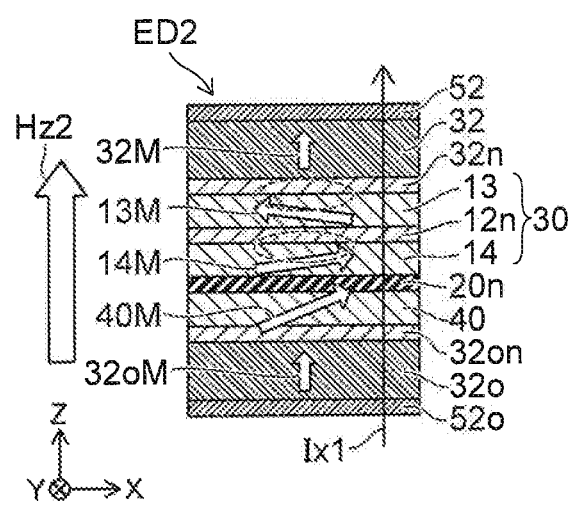

FIG. 8A and FIG. 8B are schematic cross-sectional views illustrating another oscillator according to the first embodiment.

The first element ED1 illustrated in FIG. 8A corresponds to the oscillator 110b according to the embodiment. In the oscillator 110b, a first opposing magnetic portion 31o is further provided in addition to the first magnetic portion 31. Otherwise, the configuration of the oscillator 110b is similar to the configuration of the oscillator 110.

As shown in FIG. 8A, the first element ED1 further includes the first opposing magnetic portion 31o. A first opposing magnetic portion magnetization 31oM of the first opposing magnetic portion 31o is aligned with the first direction (the Z-axis direction). In the first direction (the Z-axis direction), the first magnetic layer 10, the second magnetic layer 20, and the first nonmagnetic layer 10n are positioned between the first magnetic portion 31 and the first opposing magnetic portion 31o.

The first element nonmagnetic layer 31n and a first element opposing nonmagnetic layer 31on are provided in the example. The first magnetic layer 10 is positioned between the first magnetic portion 31 and the first opposing magnetic portion 31o. The second magnetic layer 20 is positioned between the first opposing magnetic portion 31o and the first magnetic layer 10. The first element nonmagnetic layer 31n is positioned between the first magnetic portion 31 and the first magnetic layer 10. The first element opposing nonmagnetic layer 31on is positioned between the first opposing magnetic portion 31o and the second magnetic layer 20.

In the first element ED1, the first magnetic field Hz1 is based on at least a portion of the magnetic field formed by the first magnetic portion 31 and the first opposing magnetic portion 31o.

In the second element ED2 illustrated in FIG. 8B, a second opposing magnetic portion 32o is further provided in addition to the second magnetic portion 32. Otherwise, the configuration of the second element ED2 illustrated in FIG. 8B is similar to the configuration of the second element ED2 illustrated in FIG. 2B.

As shown in FIG. 8B, the second element ED2 further includes the second opposing magnetic portion 32o. A second opposing magnetic portion magnetization 32oM of the second opposing magnetic portion 32o is aligned with the second element direction (in the example, the Z-axis direction). In the second element direction (in the example, the Z-axis direction), the third magnetic layer 30, the fourth magnetic layer 40, and the second nonmagnetic layer 20n are positioned between the second magnetic portion 32 and the second opposing magnetic portion 32o.

The second element ED2 further includes the second element nonmagnetic layer 32n and a second element opposing nonmagnetic layer 32on. The third magnetic layer 30 is positioned between the second magnetic portion 32 and the second opposing magnetic portion 32o. The fourth magnetic layer 40 is positioned between the second opposing magnetic portion 32o and the third magnetic layer 30. The second element nonmagnetic layer 32n is positioned between the second magnetic portion 32 and the third magnetic layer 30. For example, the second element nonmagnetic layer 32n is positioned between the second magnetic portion 32 and the third magnetic film 13. The second element opposing nonmagnetic layer 32on is positioned between the second opposing magnetic portion 32o and the fourth magnetic layer 40.

The second magnetic field Hz2 of the second element ED2 is based on at least a portion of the magnetic field formed by the second magnetic portion 32 and the second opposing magnetic portion 32o.

Figure 9A:
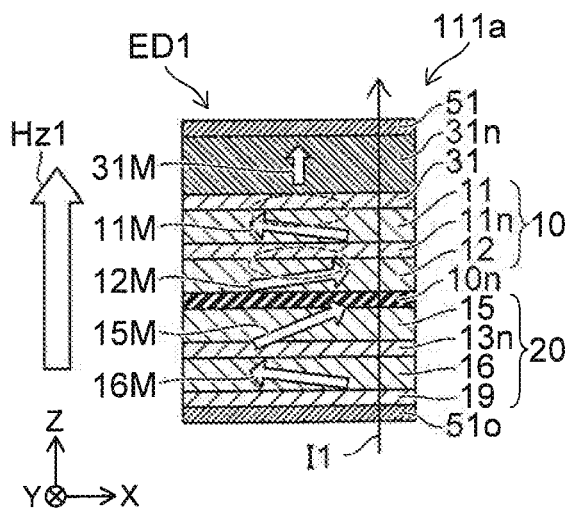
FIG. 9A and FIG. 9B are schematic cross-sectional views illustrating another oscillator according to the first embodiment.
Figure 9B:
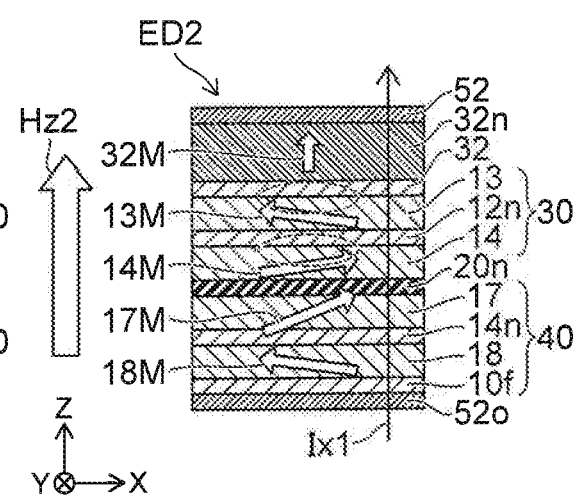

FIG. 9A and FIG. 9B are schematic cross-sectional views illustrating another oscillator according to the first embodiment.

The first element ED1 illustrated in FIG. 9A corresponds to the oscillator 111a according to the embodiment. The position of the first magnetic portion 31 of the oscillator 111a is different from the position of the first magnetic portion 31 of the oscillator 111 (referring to FIG. 2A). In the oscillator 111a, the second magnetic layer 20 includes the fifth magnetic film 15, the sixth magnetic film 16, and the third nonmagnetic film 13n.

The position of the second magnetic portion 32 of the second element ED2 illustrated in FIG. 9B is different from the position of the second magnetic portion 32 of the second element ED2 illustrated in FIG. 2B. In the second element ED2 illustrated in FIG. 9B, the fourth magnetic layer 40 includes the fifth magnetic film 15, the eighth magnetic film 18, and the fourth nonmagnetic film 14n.

Figure 10A:
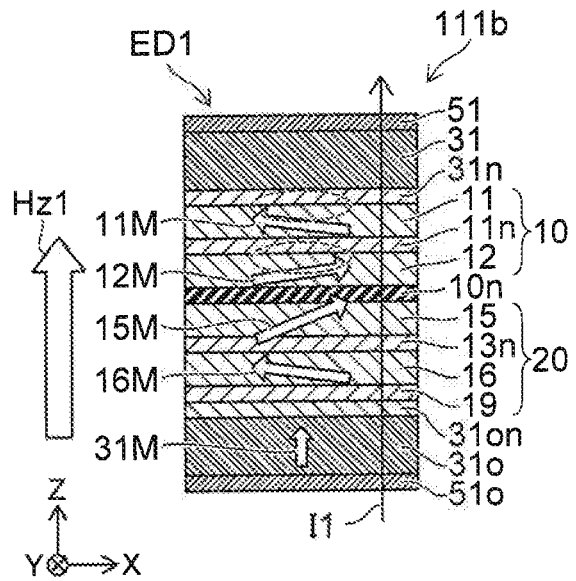
FIG. 10A and FIG. 10B are schematic cross-sectional views illustrating another oscillator according to the first embodiment.
Figure 10B:
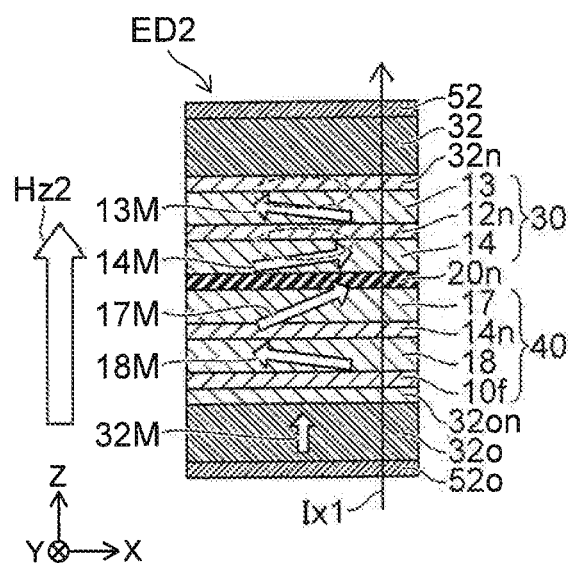

FIG. 10A and FIG. 10B are schematic cross-sectional views illustrating another oscillator according to the first embodiment.

The first element ED1 illustrated in FIG. 10A corresponds to the oscillator 111b according to the embodiment. In the oscillator 111b, the first opposing magnetic portion 31o is provided in addition to the first magnetic portion 31. In the oscillator 111b, the second magnetic layer 20 includes the fifth magnetic film 15; the sixth magnetic film 16, and the third nonmagnetic film 13n. The first element opposing nonmagnetic layer 31on is positioned between the first opposing magnetic portion 31o and the sixth magnetic film 16.

In the second element ED2 illustrated in FIG. 10B, the second opposing magnetic portion 32o is provided in addition to the second magnetic portion 32. In the second element ED2 illustrated in FIG. 10B, the fourth magnetic layer 40 includes the fifth magnetic film 15, the eighth magnetic film 18, and the fourth nonmagnetic film 14n. The second element opposing nonmagnetic layer 32on is positioned between the second opposing magnetic portion 32o and the eighth magnetic film 18.

Figure 11:
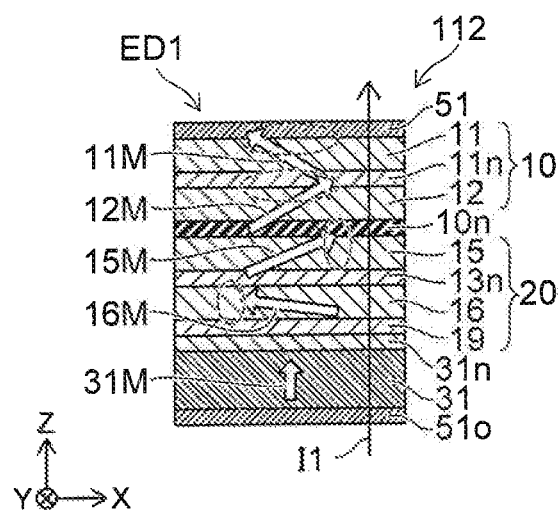
FIG. 11 is a schematic cross-sectional view illustrating another oscillator according to the first embodiment.

FIG. 11 is a schematic cross-sectional view illustrating another oscillator according to the first embodiment.

As shown in FIG. 11, the second magnetic layer 20 oscillates in the oscillator 112. For example, at least one of the first magnetization 11M or the second magnetization 12M is synchronous with at least one of the fifth magnetization 15M or the sixth magnetization 16M when the first current Ic1 (the current I1) flows along the first direction (the Z-axis direction) in the first element ED1. The oscillation of the second magnetic layer 20 is an in-plane oscillation.

For example, the ratio, to a second oscillation frequency when the second magnetic layer 20 has an in-plane oscillation, of the absolute value of the difference between the second oscillation frequency and a first oscillation frequency when the first magnetic layer 10 has an out-of-plane oscillation may be 0.1 times or less. For example, the second oscillation frequency may be substantially an integer multiple (e.g., 2 times) of the first oscillation frequency. For example, the first oscillation frequency may be substantially an integer multiple (e.g., 2 times) of the second oscillation frequency. Thereby, a dipole interaction occurs between the first magnetic layer 10 and the second magnetic layer 20. Thereby, for example, the synchronous oscillations can be excited in these magnetic layers. For example, oscillations that have high outputs and stable frequencies are obtained.

For example, at least one of the first magnetization 11M or the second magnetization 12M may be synchronized with the second magnetic layer magnetization 20M of the second magnetic layer 20 (referring to FIG. 1B) when the first current Ic1 (the current I1) flows along the first direction in the first element ED1.

By providing at least one of the first magnetic portion 31 or the first opposing magnetic portion 31o in the embodiment, the leakage magnetic field from these magnetic portions is applied to the first magnetic layer 10 and the second magnetic layer 20. A perpendicular magnetic field may not be applied from the outside. Or, the magnitude of the magnetic field applied from the outside can be small.

By providing the first magnetic portion 31 and the first opposing magnetic portion 31o, the uniformity of the magnetic field applied to the first magnetic layer 10 and the second magnetic layer 20 is increased. For example, in the first magnetic layer 10, a spatially uniform and stable oscillation is obtained. For example, the output based on the MR effect improves.

Figure 12:
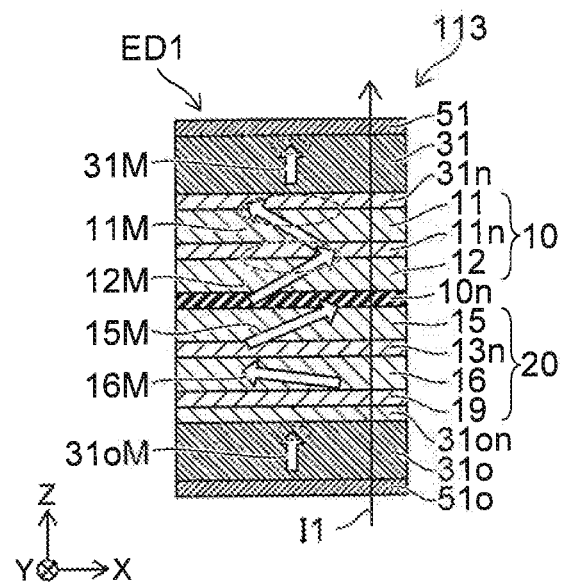
FIG. 12 is a schematic cross-sectional view illustrating another oscillator according to the first embodiment.

FIG. 12 is a schematic cross-sectional view illustrating another oscillator according to the first embodiment.

As shown in FIG. 12, the first magnetic portion magnetization 31M of the first magnetic portion 31 may oscillate as in the oscillator 113 according to the embodiment. The oscillation of the first magnetic layer 10 may be synchronized with the oscillation of the first magnetic portion 31. For example, the temporal change of at least one of the first magnetization 11M or the second magnetization 12M may be synchronized with the temporal change of the first magnetic portion magnetization 31M when the first current Ic1 flows along the first direction (the Z-axis direction).

The first opposing magnetic portion magnetization 31oM of the first opposing magnetic portion 31o may oscillate. For example, the temporal change of at least one of the first magnetization 11M or the second magnetization 12M may be synchronized with the temporal change of at least one of the first magnetic portion magnetization 31M or the first opposing magnetic portion magnetization 31oM when the first current Ic1 flows along the first direction in the first element ED1.

For example, the difference between the oscillation frequency of the first magnetic layer 10 and the resonance frequency of at least one of the first magnetic portion 31 or the first opposing magnetic portion 31o may be small. For example, the ratio, to the resonance frequency of at least one of the first magnetic portion 31 or the first opposing magnetic portion 31o, of the absolute value of the difference between the resonance frequency and the oscillation frequency of the first magnetic layer 10 may be, for example, 0.1 or less. For example, the resonance frequency may be substantially an integer multiple (e.g., 2 times) of the oscillation frequency. For example, the oscillation frequency may be substantially an integer multiple (e.g., 2 times) of the resonance frequency. For example, a dipole interaction occurs between the first magnetic layer 10 and the first magnetic portion 31 or between the first magnetic layer 10 and the first opposing magnetic portion 31o. For example, synchronous oscillations can be performed. Thereby, for example, the frequency stability can be improved.

In the embodiment, at least one of the first to eighth magnetic films 11 to 18 includes, for example, at least one selected from the group consisting of Co, Fe, and Ni. At least one of the first to eighth magnetic films 11 to 18 may further include boron.

At least one of the second magnetic layer 20 or the fourth magnetic layer 40 includes, for example, at least one selected from the group consisting of Co, Fe, and Ni. At least one of the second magnetic layer 20 or the fourth magnetic layer 40 may further include boron.

At least one of the first to fourth nonmagnetic films 11n to 14n includes, for example, at least one selected from the group consisting of Ru, Cu, and Cr.

At least one of the first nonmagnetic layer 10n or the second nonmagnetic layer 20n includes, for example, an oxide including at least one selected from the group consisting of Mg and Al, a nitride including at least one selected from the group, or an oxynitride including at least one selected from the group.

At least one of the first magnetic portion 31, the first opposing magnetic portion 31o, the second magnetic portion 32, or the second opposing magnetic portion 32o includes, for example, at least one selected from the group consisting of Co, Fe, Ni, or Gd.

At least one of the first element nonmagnetic layer 31n, the first element opposing nonmagnetic layer 31on, the second element nonmagnetic layer 32n, or the second element opposing nonmagnetic layer 32on includes, for example, at least one selected from the group consisting of Ta and W.

As described above, at least one of the ninth magnetic film 19 or the tenth magnetic film 10f includes at least one selected from the group consisting of IrMn and PtMn.

In the embodiment recited above, at least one of the first magnetic portion 31, the first opposing magnetic portion 31o, the second magnetic portion 32, or the second opposing magnetic portion 32o may be omitted. In such a case, for example, the first magnetic field Hz1 may be applied to the first element ED1 by a magnetic field generator provided outside the first element ED1. For example, the second magnetic field Hz2 may be applied to the second element ED2 by a magnetic field generator provided outside the second element ED2.

Second Embodiment

The embodiment relates to a calculating device. The calculating device includes any multiple oscillators according to the first embodiment.

Figure 13:
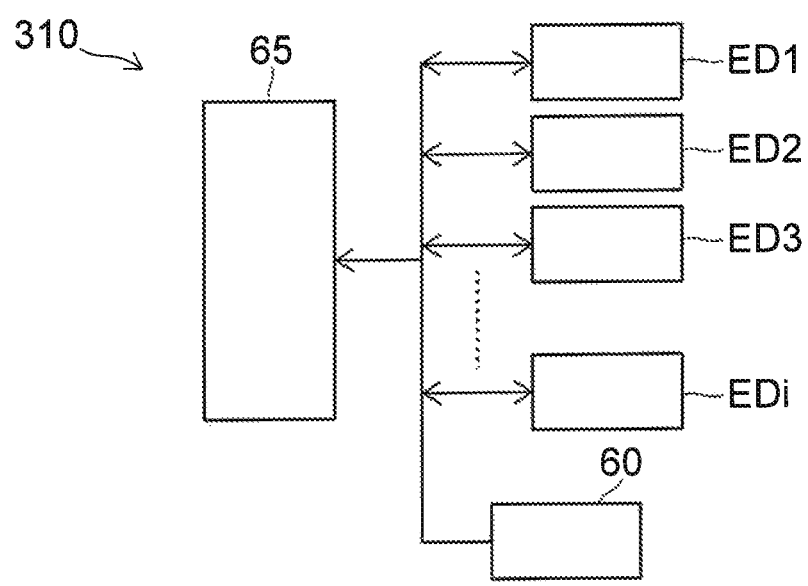
FIG. 13 is a schematic view illustrating the calculating device according to the second embodiment.

FIG. 13 is a schematic view illustrating the calculating device according to the second embodiment.

As shown in FIG. 13, the calculating device 310 according to the embodiment includes multiple oscillators (e.g., the first element ED1, the second element ED2, a third element ED3, an ith element EDi, etc.). "i" is an integer of two or more. At least one of the multiple oscillators includes the oscillator (the element) according to the first embodiment. The multiple oscillators (the multiple elements) are connected in parallel with each other.

The calculating device 310 includes the current supply circuit 60 and a sense circuit 65. For example, the current supply circuit 60 is configured to supply a current to the multiple oscillators (e.g., the first element ED1, the second element ED2, etc.). For example, the sense circuit 65 is configured to sense the temporal change of the electrical resistances of the multiple oscillators in the oscillating state. For example, the sense circuit 65 is configured to sense the temporal changes of the first electrical resistance R1 and the second electrical resistance R2 of the first element ED1 in the first state ST1 (the oscillating state) recited above.

For example, the multiple oscillators and the sense circuit 65 are electrically coupled. The sense circuit 65 is, for example, an averaging circuit.

For example, oscillation frequencies ω1, ω2, ω3, and ωi of the first element ED1, the second element ED2, the third element ED3, and the ith element EDi are represented by the following formulas.

$$\omega 1 = \omega 0 + \Delta\omega(x_{0,1} - z_{m,1})$$

$$\omega 2 = \omega 0 + \Delta\omega(x_{0,2} - z_{m,2})$$

$$\omega 3 = \omega 0 + \Delta\omega(x_{0,3} - z_{m,3})$$

$$\omega i = \omega 0 + \Delta\omega(x_{0,i} - z_{m,i})$$

ω0 is the reference frequency. $x_{0,1}$, $x_{0,2}$, $x_{0,3}$, and $x_{0,i}$ are input data. $z_{m,1}$, $z_{m,2}$, $z_{m,3}$, and $z_{m,i}$ are reference data. The term of "$\Delta\omega(x_{0,i} - z_{m,i})$" corresponds to the frequency shift.

For example, a signal that corresponds to the oscillation frequency of the multiple oscillators (the multiple elements) is supplied to the sense circuit 65.

The multiple oscillators (the multiple elements) are connected in parallel with each other and have synchronous oscillations. For example, the current that is supplied to each of the multiple oscillators from the current supply circuit 60 is controlled according to the input data (the input value). At this time, for example, the amplitude of the synchronous oscillations changes according to the input data. The change of the amplitude is sensed by the sense circuit 65. The current supply circuit 60 may have the function of a controller.

For example, the frequency of the synchronous oscillations may change according to the input data. The change of the frequency may be sensed by the sense circuit 65.

The current that is supplied to each of the multiple oscillators from the current supply circuit 60 may be modified according to the reference data (the reference value). At this time, for example, at least one of the amplitude or the frequency of the synchronous oscillations may change according to the input data. The change of the at least one of the amplitude or the frequency may be sensed by the sense circuit 65.

Thus, at least one of the amplitude or the frequency of the synchronous oscillations that changes according to at least one of the input value or the reference value is sensed. Thereby, for example, a product-sum operation is performed. For example, the calculating device 310 can perform the product-sum operation.

In the embodiment, a stable operation is possible for multiple oscillators. In the embodiment, the signal that is obtained from the multiple oscillators has a high output. For example, high electrical coupling is obtained. For example, synchronization is easy. Stable calculations are possible.

There is an operator that utilizes a synchronous phenomenon by electrically coupling multiple spin torque oscillators (STOs) to each other. The electrical coupling can be strengthened by setting the high frequency output from the STOs to be high. Thereby, stable synchronization is obtained. On the other hand, there is a configuration in which an in-plane magnetization film is used as a pinned layer included in the STO; an in-plane magnetization film or a perpendicular magnetization film is used as a free layer; and the free layer has an out-of-plane oscillation. It is desirable to increase the output and stabilize the frequency of the STO.

In the embodiment, for example, an in-plane magnetization film is used as the pinned layer; and multiple in-plane magnetization films that are antiferromagnetically coupled to each other are used as the free layers. Then, for example, the free layers are caused to oscillate out-of-plane by applying a magnetic field along the stacking direction of the element. For example, even when the magnetic field is applied along the stacking direction of the element, the magnetizations of the free layers do not easily tilt upward out of the plane. For example, the oscillations occur in a state in which the cone angles of the oscillations of the magnetizations of the free layers are near 90 degrees. For example, the MR effect can be utilized effectively. For example, stable oscillations are obtained. For example, a stable and high output is obtained.

The embodiments may include the following configurations (e.g., technological proposals).

Configuration 1

An oscillator, comprising a first element including a first magnetic layer, a second magnetic layer, and a first nonmagnetic layer, the first magnetic layer including a first magnetic film, a second magnetic film, and a first nonmagnetic film provided between the first magnetic film and the second magnetic film, the second magnetic film being positioned between the second magnetic layer and the first magnetic film, the first nonmagnetic layer being provided between the second magnetic film and the second magnetic layer, an orientation of a first magnetization of the first magnetic film having a reverse component of an orientation of a second magnetization of the second magnetic film, a first magnetic field along a first direction being applied to the first element, the first direction being from the second magnetic film toward the first magnetic film, the first element being in a first state when a first current flows along the first direction in the first element, an electrical resistance of the first element in the first state including a first electrical resistance and a second electrical resistance repeating alternately, the second electrical resistance being lower than the first electrical resistance.

Configuration 2

The oscillator according to Configuration 1, wherein the first element further includes a first magnetic portion, a direction from the first magnetic portion toward the first magnetic layer is aligned with the first direction, and a first magnetic portion magnetization of the first magnetic portion is aligned with the first direction.

Configuration 3

An oscillator, comprising:

a first element; and a second element, the first element including a first magnetic layer, a second magnetic layer, and a first nonmagnetic layer, the first magnetic layer including a first magnetic film, a second magnetic film, and a first nonmagnetic film provided between the first magnetic film and the second magnetic film, the second magnetic film being positioned between the second magnetic layer and the first magnetic film, the first nonmagnetic layer being provided between the second magnetic film and the second magnetic layer, the second element including a third magnetic layer, a fourth magnetic layer, and a second nonmagnetic layer, the third magnetic layered including a third magnetic film, a fourth magnetic film, and a second nonmagnetic film provided between the third magnetic film and the fourth magnetic film, the fourth magnetic film being positioned between the fourth magnetic layer and the third magnetic film, the second nonmagnetic layer being provided between the fourth magnetic film and the fourth magnetic layer, the first magnetic layer being electrically connected to the third magnetic layer, the second magnetic layer being electrically connected to the fourth magnetic layer, an orientation of a first magnetization of the first magnetic film having a reverse component of an orientation of a second magnetization of the second magnetic film, a first magnetic field along a first direction being applied to the first element, the first direction being from the second magnetic film toward the first magnetic film, the first element being in a first state when a first current flows along the first direction in the first element, an electrical resistance of the first element in the first state including a first electrical resistance and a second electrical resistance repeating alternately, the second electrical resistance being lower than the first electrical resistance, the first element being in a second state when a second current flows along the first direction in the first element, the absolute value of the second current being less than the absolute value of the first current, a third electrical resistance of the first element in the second state being lower than at least one of the first electrical resistance or the second electrical resistance.

Configuration 4

The oscillator according to Configuration 3, wherein the first element further includes a first magnetic portion, a direction from the first magnetic portion toward the first magnetic layer is aligned with the first direction, a first magnetic portion magnetization of the first magnetic portion is aligned with the first direction, the second element further includes a second magnetic portion, a second magnetic field along a second element direction is applied to the second element, the second element direction being from the fourth magnetic film toward the third magnetic film, a direction from the second magnetic portion toward the third magnetic layer is aligned with the second element direction, and a second magnetic portion magnetization of the second magnetic portion is aligned with the first direction.

Configuration 5

An oscillator, comprising a first element including a first magnetic layer, a second magnetic layer, a first nonmagnetic layer, and a first magnetic portion, the first magnetic layer including a first magnetic film, a second magnetic film, and a first nonmagnetic film provided between the first magnetic film and the second magnetic film, the second magnetic film being positioned between the second magnetic layer and the first magnetic film, the first nonmagnetic layer being provided between the second magnetic film and the second magnetic layer, a direction from the first magnetic portion toward the first magnetic layer being aligned with a first direction, the first direction being from the second magnetic film toward the first magnetic film, a first magnetic portion magnetization of the first magnetic portion being aligned with the first direction, an orientation of a first magnetization of the first magnetic film having a reverse component of an orientation of a second magnetization of the second magnetic film, the first element being in a first state when a first current flows along the first direction in the first element, an electrical resistance of the first element in the first state including a first electrical resistance and a second electrical resistance repeating alternately, the second electrical resistance being lower than the first electrical resistance.

Configuration 6

An oscillator, comprising:

a first element; and a second element, the first element including a first magnetic layer, a second magnetic layer, a first nonmagnetic layer, and a first magnetic portion, the first magnetic layer including a first magnetic film, a second magnetic film, and a first nonmagnetic film provided between the first magnetic film and the second magnetic film, the second magnetic film being positioned between the second magnetic layer and the first magnetic film, the first nonmagnetic layer being provided between the second magnetic film and the second magnetic layer, a direction from the first magnetic portion toward the first magnetic layer being aligned with a first direction, the first direction being from the second magnetic film toward the first magnetic film, a first magnetic portion magnetization of the first magnetic portion being aligned with the first direction, the second element including a third magnetic layer, a fourth magnetic layer, a second nonmagnetic layer, and a second magnetic portion, the third magnetic layer including a third magnetic film, a fourth magnetic film, and a second nonmagnetic film provided between the third magnetic film and the fourth magnetic film, a fourth magnetic film being positioned between the fourth magnetic layer and the third magnetic film, the second nonmagnetic layer being provided between the fourth magnetic film and the fourth magnetic layer, a direction from the second magnetic portion toward the third magnetic layer being aligned with a second element direction, the second element direction being from the fourth magnetic film toward the third magnetic film, a second magnetic portion magnetization of the second magnetic portion being aligned with the second element direction, the first magnetic layer being electrically connected to the third magnetic layer, the second magnetic layer being electrically connected to the fourth magnetic layer, an orientation of a first magnetization of the first magnetic film having a reverse component of an orientation of a second magnetization of the second magnetic film, the first element being in a first state when a first current flows along the first direction in the first element, an electrical resistance of the first element in the first state including a first electrical resistance and a second electrical resistance repeating alternately, the second electrical resistance being lower than the first electrical resistance, the first element being in a second state when a second current flows along the first direction in the first element, the absolute value of the second current being less than the absolute value of the first current, a third electrical resistance of the first element in the second state being lower than at least one of the first electrical resistance or the second electrical resistance.

Configuration 7

The oscillator according to Configuration 6, wherein the second element is in a third state when a third current flows along the second element direction in the second element, an electrical resistance of the second element in the third state including a fourth electrical resistance and a fifth electrical resistance repeating alternately, the fifth electrical resistance being lower than the fourth electrical resistance, the second element is in a fourth state when a fourth current flows along the second element direction in the second element, the absolute value of the fourth current being less than the absolute value of the third current, and a temporal change of the fourth electrical resistance and the fifth electrical resistance is synchronized with a temporal change of the first electrical resistance and the second electrical resistance.

Configuration 8

The oscillator according to Configuration 6, wherein a sixth electrical resistance of the second element in the fourth state is lower than at least one of the fourth electrical resistance or the fifth electrical resistance.

Configuration 9

The oscillator according to any one of Configurations 6 to 8, wherein the second element further includes a second element nonmagnetic layer, the fourth magnetic layer is positioned between the second magnetic portion and the third magnetic layer, and the second element nonmagnetic layer is positioned between the second magnetic portion and the fourth magnetic layer.

Configuration 10

The oscillator according to any one of Configurations 6 to 8, wherein the second element further includes a second element nonmagnetic layer, the third magnetic layer is positioned between the second magnetic portion and the fourth magnetic layer, and the second element nonmagnetic layer is positioned between the second magnetic portion and the third magnetic layer.

Configuration 11

The oscillator according to any one of Configurations 6 to 8, wherein the second element further includes a second opposing magnetic portion, a second opposing magnetic portion magnetization of the second opposing magnetic portion is aligned with the second element direction, and the third magnetic layer, the fourth magnetic layer, and the second nonmagnetic layer are positioned between the second magnetic portion and the second opposing magnetic portion in the second element direction.

Configuration 12

The oscillator according to Configuration 11, wherein the second element further includes a second element nonmagnetic layer and a second element opposing nonmagnetic layer, the third magnetic layer is positioned between the second magnetic portion and the second opposing magnetic portion, the fourth magnetic layer is positioned between the second opposing magnetic portion and the third magnetic layer, the second element nonmagnetic layer is positioned between the second magnetic portion and the third magnetic layer, and the second element opposing nonmagnetic layer is positioned between the second opposing magnetic portion and the fourth magnetic layer.

Configuration 13

The oscillator according to any one of Configurations 6 to 12, wherein an orientation of a third magnetization of the third magnetic film has a reverse component of an orientation of a fourth magnetization of the fourth magnetic film.

Configuration 14

The oscillator according to Configuration 13, wherein the third magnetization and the fourth magnetization cross the second element direction.

Configuration 15

The oscillator according to any one of Configurations 6 to 14, wherein a fourth magnetic layer magnetization of the fourth magnetic layer crosses the second element direction.

Configuration 16

The oscillator according to any one of Configurations 6 to 15, wherein the fourth magnetic layer includes a seventh magnetic film, an eighth magnetic film, and a fourth nonmagnetic film, the seventh magnetic film is positioned between the eighth magnetic film and the fourth magnetic film, the fourth nonmagnetic film is positioned between the seventh magnetic film and the eighth magnetic film, a seventh magnetization of the seventh magnetic film and an eighth magnetization of the eighth magnetic film cross the second element direction, and an orientation of the seventh magnetization has a reverse component of an orientation of the eighth magnetization.

Configuration 17

The oscillator according to Configuration 16, wherein the fourth magnetic layer further includes a tenth magnetic film, the eighth magnetic film is positioned between the tenth magnetic film and the seventh magnetic film, and the tenth magnetic film includes at least one selected from the group consisting of IrMn and PtMn.

Configuration 18

The oscillator according to any one of Configurations 5 to 17, wherein the first magnetization and the second magnetization cross the first direction.

Configuration 19

The oscillator according to any one of Configurations 5 to 18, wherein a second magnetic layer magnetization of the second magnetic layer crosses the first direction.

Configuration 20

The oscillator according to any one of Configurations 5 to 19, wherein the first element further includes a first element nonmagnetic layer, the second magnetic layer is positioned between the first magnetic portion and the first magnetic layer, and the first element nonmagnetic layer is positioned between the first magnetic portion and the second magnetic layer.

Configuration 21

The oscillator according to any one of Configurations 5 to 19, wherein the first element further includes a first element nonmagnetic layer, the first magnetic layer is positioned between the first magnetic portion and the second magnetic layer, and the first element nonmagnetic layer is positioned between the first magnetic portion and the first magnetic layer.

Configuration 22

The oscillator according to Configuration 20 or 21, wherein a temporal change of at least one of the first magnetization or the second magnetization is synchronous with a temporal change of the first magnetic portion magnetization when the first current flows along the first direction in the first element.

Configuration 23

The oscillator according to any one of Configurations 5 to 19, wherein
the first element further includes a first opposing magnetic portion,
a first opposing magnetic portion magnetization of the first opposing magnetic portion is aligned with the first direction, and
the first magnetic layer, the second magnetic layer, and the first nonmagnetic layer are positioned between the first magnetic portion and the first opposing magnetic portion in the first direction.

Configuration 24

The oscillator according to Configuration 23, wherein a temporal change of at least one of the first magnetization or the second magnetization is synchronous with a temporal change of at least one of the first magnetic portion magnetization or the first opposing magnetic portion magnetization when the first current flows along the first direction in the first element.

Configuration 25

The oscillator according to Configuration 22 or 23, wherein
the first element further includes a first element nonmagnetic layer and a first element opposing nonmagnetic layer,
the first magnetic layer is positioned between the first magnetic portion and the first opposing magnetic portion,
the second magnetic layer is positioned between the first opposing magnetic portion and the first magnetic layer,
the first element nonmagnetic layer is positioned between the first magnetic portion and the first magnetic layer, and
the first element opposing nonmagnetic layer is positioned between the first opposing magnetic portion and the second magnetic layer.

Configuration 26

The oscillator according to any one of Configurations 5 to 24, wherein
the second magnetic layer includes a fifth magnetic film, a sixth magnetic film, and a third nonmagnetic film,
the fifth magnetic film is positioned between the sixth magnetic film and the second magnetic film,
the third nonmagnetic film is positioned between the fifth magnetic film and the sixth magnetic film,
a fifth magnetization of the fifth magnetic film and a sixth magnetization of the sixth magnetic film cross the first direction, and
an orientation of the fifth magnetization has a reverse component of an orientation of the sixth magnetization.

Configuration 27

The oscillator according to any one of Configurations 5 to 26, wherein at least one of the first magnetization or the second magnetization is synchronous with at least one of the fifth magnetization or the sixth magnetization when the first current flows along the first direction in the first element.

Configuration 28

The oscillator according to Configuration 26 or 27, wherein
the second magnetic layer further includes a ninth magnetic film,
the sixth magnetic film 16 is positioned between the ninth magnetic film and the fifth magnetic film, and
the ninth magnetic film includes at least one selected from the group consisting of IrMn and PtMn.

Configuration 29

The oscillator according to any one of Configurations 5 to 28, wherein
a component along the first direction of the orientation of the first magnetization is from the second magnetic film toward the first magnetic film, and a component along the first direction of the orientation of the second magnetization is from the second magnetic film toward the first magnetic film, or
the component along the first direction of the orientation of the first magnetization is from the first magnetic film toward the second magnetic film, and the component along the first direction of the orientation of the second magnetization is from the first magnetic film toward the second magnetic film.

Configuration 30

The oscillator according to any one of Configurations 5 to 29, wherein at least one of the first magnetization or the second magnetization is synchronous with the second magnetic layer magnetization when the first current flows along the first direction in the first element.

Configuration 31

The oscillator according to any one of Configurations 5 to 30, wherein the first nonmagnetic layer includes an oxide including at least one selected from the group consisting of Mg and Al, a nitride including at least one selected from the group, or an oxynitride including at least one selected from the group.

Configuration 32

A calculating device, comprising:
the oscillator according to any one of Configurations 6 to 16;
a current supply circuit portion configured to supply a current to the first element and the second element; and
a sense circuit configured to sense a temporal change of the first electrical resistance and the second electrical resistance in the first state.

According to the embodiments, an oscillator and a calculating device can be provided in which stable operations are possible.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

In the specification, a state of being electrically connected includes a state in which a first conductor and a second conductor contact each other. A state of being electrically connected includes a state in which a third conductor is provided in a current path between the first conductor and the second conductor and current flows in this current path. A state of being electrically connected includes a state being possible to form a state in which a control element such as a switch is provided in a current path between the first conductor and the second conductor and current flows in the current path by the operation of the control element.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in oscillators or calculating devices such as magnetic layers, magnetic films, magnetic portions, nonmagnetic layers, interconnects, current supply circuits, sense circuits, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all oscillators, and calculating devices practicable by an appropriate design modification by one skilled in the art based on the oscillators, and the calculating devices described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims, and their equivalents are intended to cover such forms or modifications as would fall within the scope and spirit of the invention.

What is claimed is:

1. An oscillator, comprising:
a first element; and
a second element,
the first element including a first magnetic layer, a second magnetic layer, and a first nonmagnetic layer,
the first magnetic layer including a first magnetic film, a second magnetic film, and a first nonmagnetic film provided between the first magnetic film and the second magnetic film,
the second magnetic film being provided between the second magnetic layer and the first magnetic film,
the first nonmagnetic layer being provided between the second magnetic film and the second magnetic layer,
the second element including a third magnetic layer, a fourth magnetic layer, and a second nonmagnetic layer,
the third magnetic layer including a third magnetic film, a fourth magnetic film, and a second nonmagnetic film provided between the third magnetic film and the fourth magnetic film,
the fourth magnetic film being provided between the fourth magnetic layer and the third magnetic film,
the second nonmagnetic layer being provided between the fourth magnetic film and the fourth magnetic layer,
the first magnetic layer being electrically connected to the third magnetic layer,
the second magnetic layer being electrically connected to the fourth magnetic layer,
an orientation of a first magnetization of the first magnetic film having a reverse component of an orientation of a second magnetization of the second magnetic film,
a first magnetic field along a first direction being applied to the first element, the first direction being from the second magnetic film toward the first magnetic film,
the first element being in a first state when a first current flows along the first direction in the first element, an electrical resistance of the first element in the first state including a first electrical resistance and a second electrical resistance repeating alternately, the second electrical resistance being lower than the first electrical resistance,
the first element being in a second state when a second current flows along the first direction in the first element, the absolute value of the second current being less than the absolute value of the first current, a third electrical resistance of the first element in the second state being lower than at least one of the first electrical resistance or the second electrical resistance.

2. The oscillator according to claim 1, wherein
the first element further includes a first magnetic portion,
a direction from the first magnetic portion toward the first magnetic layer is aligned with the first direction,
a first magnetic portion magnetization of the first magnetic portion is aligned with the first direction,
the second element further includes a second magnetic portion,
a second magnetic field along a second element direction is applied to the second element, the second element direction being from the fourth magnetic film toward the third magnetic film,
a direction from the second magnetic portion toward the third magnetic layer is aligned with the second element direction, and
a second magnetic portion magnetization of the second magnetic portion is aligned with the first direction.

3. An oscillator, comprising:
a first element; and
a second element,
the first element including a first magnetic layer, a second magnetic layer, a first nonmagnetic layer, and a first magnetic portion,
the first magnetic layer including a first magnetic film, a second magnetic film, and a first nonmagnetic film provided between the first magnetic film and the second magnetic film,
the second magnetic film being provided between the second magnetic layer and the first magnetic film,
the first nonmagnetic layer being provided between the second magnetic film and the second magnetic layer,
a direction from the first magnetic portion toward the first magnetic layer being aligned with a first direction, the first direction being from the second magnetic film toward the first magnetic film, a first magnetic portion magnetization of the first magnetic portion being aligned with the first direction,
the second element including a third magnetic layer, a fourth magnetic layer, a second nonmagnetic layer, and a second magnetic portion,
the third magnetic layer including a third magnetic film, a fourth magnetic film, and a second nonmagnetic film provided between the third magnetic film and the fourth magnetic film,
the fourth magnetic film being provided between the fourth magnetic layer and the third magnetic film,
the second nonmagnetic layer being provided between the fourth magnetic film and the fourth magnetic layer,
a direction from the second magnetic portion toward the third magnetic layer being aligned with a second element direction, the second element direction being from the fourth magnetic film toward the third magnetic film, a second magnetic portion magnetization of the second magnetic portion being aligned with the second element direction, the first magnetic layer being electrically connected to the third magnetic layer, the second magnetic layer being electrically connected to the fourth magnetic layer, an orientation of a first magnetization of the first magnetic film having a reverse component of an orientation of a second magnetization of the second magnetic film, the first element being in a first state when a first current flows along the first direction in the first element, an electrical resistance of the first element in the first state including a first electrical resistance and a second electrical resistance repeating alternately, the second electrical resistance being lower than the first electrical resistance, the first element being in a second state when a second current flows along the first direction in the first element, the absolute value of the second current being less than the absolute value of the first current, a third electrical resistance of the first element in the second state being lower than at least one of the first electrical resistance or the second electrical resistance.

4. The oscillator according to claim 3, wherein the second element is in a third state when a third current flows along the second element direction in the second element, an electrical resistance of the second element in the third state including a fourth electrical resistance and a fifth electrical resistance repeating alternately, the fifth electrical resistance being lower than the fourth electrical resistance, the second element is in a fourth state when a fourth current flows along the second element direction in the second element, the absolute value of the fourth current being less than the absolute value of the third current, and a temporal change of the fourth electrical resistance and the fifth electrical resistance is synchronized with a temporal change of the first electrical resistance and the second electrical resistance.

5. The oscillator according to claim 3, wherein a sixth electrical resistance of the second element in the fourth state is lower than at least one of the fourth electrical resistance or the fifth electrical resistance.

6. The oscillator according to claim 3, wherein the second element further includes a second element nonmagnetic layer, the fourth magnetic layer is provided between the second magnetic portion and the third magnetic layer, and the second element nonmagnetic layer is provided between the second magnetic portion and the fourth magnetic layer.

7. The oscillator according to claim 3, wherein the second element further includes a second element nonmagnetic layer, the third magnetic layer is provided between the second magnetic portion and the fourth magnetic layer, and the second element nonmagnetic layer is provided between the second magnetic portion and the third magnetic layer.

8. The oscillator according to claim 3, wherein the second element further includes a second opposing magnetic portion, a second opposing magnetic portion magnetization of the second opposing magnetic portion is aligned with the second element direction, and the third magnetic layer, the fourth magnetic layer, and the second nonmagnetic layer are provided between the second magnetic portion and the second opposing magnetic portion in the second element direction.

9. The oscillator according to claim 8, wherein the second element further includes a second element nonmagnetic layer and a second element opposing nonmagnetic layer, the third magnetic layer is provided between the second magnetic portion and the second opposing magnetic portion, the fourth magnetic layer is provided between the second opposing magnetic portion and the third magnetic layer, the second element nonmagnetic layer is provided between the second magnetic portion and the third magnetic layer, and the second element opposing nonmagnetic layer is provided between the second opposing magnetic portion and the fourth magnetic layer.

10. The oscillator according to claim 3, wherein an orientation of a third magnetization of the third magnetic film has a reverse component of an orientation of a fourth magnetization of the fourth magnetic film.

11. The oscillator according to claim 10, wherein the third magnetization and the fourth magnetization cross the second element direction.

12. The oscillator according to claim 3, wherein a fourth magnetic layer magnetization of the fourth magnetic layer crosses the second element direction.

13. The oscillator according to claim 3, wherein the fourth magnetic layer includes a seventh magnetic film, an eighth magnetic film, and a fourth nonmagnetic film, the seventh magnetic film is provided between the eighth magnetic film and the fourth magnetic film, the fourth nonmagnetic film is provided between the seventh magnetic film and the eighth magnetic film, a seventh magnetization of the seventh magnetic film and an eighth magnetization of the eighth magnetic film cross the second element direction, and an orientation of the seventh magnetization has a reverse component of an orientation of the eighth magnetization.

14. The oscillator according to claim 13, wherein the fourth magnetic layer further includes a tenth magnetic film, the eighth magnetic film is provided between the tenth magnetic film and the seventh magnetic film, and the tenth magnetic film includes at least one selected from the group consisting of IrMn and PtMn.

15. The oscillator according to claim 3, wherein the first magnetization and the second magnetization cross the first direction.

16. The oscillator according to claim 3, wherein a second magnetic layer magnetization of the second magnetic layer crosses the first direction.

17. The oscillator according to claim 3, wherein the first element further includes a first element nonmagnetic layer, the second magnetic layer is provided between the first magnetic portion and the first magnetic layer, and the first element nonmagnetic layer is provided between the first magnetic portion and the second magnetic layer.

18. A calculating device, comprising:
the oscillator according to claim 3;
a current supply circuit portion configured to supply a current to the first element and the second element; and
a sense circuit configured to sense a temporal change of the first electrical resistance and the second electrical resistance in the first state.

\* \* \* \* \*